United States Patent [19]
Ishii

[11] Patent Number: 5,559,763
[45] Date of Patent: Sep. 24, 1996

[54] MAGNETIC HEAD DRIVING DEVICE AND MAGNETOOPTICAL RECORDING APPARATUS WITH ACCELERATION COIL FOR SHORTENING CURRENT INVERSION TIME

[75] Inventor: Kazuyoshi Ishii, Tokyo, Japan

[73] Assignee: Canon Kabushiki Kaisha, Tokyo, Japan

[21] Appl. No.: 26,551

[22] Filed: Mar. 4, 1993

[30] Foreign Application Priority Data

Mar. 6, 1992 [JP] Japan ................................. 4-083056
Feb. 17, 1993 [JP] Japan ................................. 5-049939

[51] Int. Cl.$^6$ .............................. G11B 5/02; G11B 11/10
[52] U.S. Cl. ............................. 369/13; 360/114; 360/46; 360/67; 360/68
[58] Field of Search ................... 360/59, 67, 68, 360/114, 66, 46; 369/13, 124; 327/110

[56] References Cited

U.S. PATENT DOCUMENTS

| | | | |
|---|---|---|---|
| 4,638,382 | 1/1987 | Sochor | 360/68 |
| 4,937,802 | 6/1990 | Omori et al. | 369/13 |
| 5,121,369 | 6/1992 | Makansi | 369/13 |
| 5,163,032 | 11/1992 | Van Nieuwland et al. | 369/13 |
| 5,233,577 | 8/1993 | Bakx et al. | 369/13 |
| 5,278,809 | 1/1994 | Ogata | 369/13 |
| 5,278,818 | 1/1994 | Zucker et al. | 369/13 X |
| 5,307,329 | 4/1994 | Shibuga et al. | 369/13 |

FOREIGN PATENT DOCUMENTS

| | | | |
|---|---|---|---|
| 0304298 | 2/1989 | European Pat. Off. | |
| 63-94406 | 4/1988 | Japan | |
| 1-303606 | 12/1989 | Japan | |
| 0612605 | 1/1994 | Japan | 360/68 |

OTHER PUBLICATIONS

Patent Abstracts of Japan, No. 01–213802, vol. 13, No. 524, Nov. 1989.
Patent Abstracts of Japan, No. 01–224902, vol. 16, No. 543, Nov. 1989.
Patent Abstracts of Japan, No. 01–272038, vol. 16, No. 89, Mar. 1992.
Patent Abstracts of Japan, No. 01–303606, vol. 14, No. 98, Feb. 1990.
Patent Abstracts of Japan, 03–276404, vol. 16, No. 100, Mar. 1992.

*Primary Examiner*—Robert Pascal
*Assistant Examiner*—Arnold Kinkead
*Attorney, Agent, or Firm*—Fitzpatrick, Cella, Harper & Scinto

[57] ABSTRACT

A magnetic field generation device generates a magnetic field modulated according to an information signal by switching the direction of a current to be supplied to a magnetic field generation coil of a magnetic head, according to the information signal. The device is provided with a magnetic field generation core, the magnetic field generation coil, an acceleration coil and a driving device. The magnetic field generation coil is wound around the magnetic field generation core. The acceleration coil is connected in parallel with the magnetic field generation coil to shorten a current inversion time upon generation of a magnetic field.

34 Claims, 39 Drawing Sheets

MAGNETIC HEAD DRIVING DEVICE AND MAGNETOOPTICAL RECORDING APPARATUS WITH ACCELERATION COIL FOR SHORTENING CURRENT INVERSION TIME

BACKGROUND OF THE INVENTION

1. Field of the Invention

The present invention relates to a magnetic head driving device and a magnetooptical recording apparatus incorporating the device.

2. Related Background Art

As a conventional recording method for a magnetooptical recording apparatus, an optical modulation method, a magnetic field modulation method, and the like are known. In particular, the magnetic field modulation method capable of directly overwriting new data on old data is superior to other methods in terms of, e.g., the recording speed. FIG. 1 shows a schematic arrangement of a magnetooptical recording apparatus adopting the magnetic field modulation method. In FIG. 1, a magnetooptical disk 1 as an information recording medium has a magnetooptical recording layer 1a. A magnetic head 2 prepared by winding an excitation coil $C_h$ around a magnetic core is arranged above the upper surface of the magnetooptical disk 1, and an optical head 4 is arranged below the lower surface of the disk to oppose the magnetic head 2. The optical head 4 radiates a laser beam emitted from a semiconductor laser arranged therein as a light source onto the recording layer 1a as a small beam spot so as to increase the temperature of a recording portion to a temperature equal to or higher than a Curie temperature of this portion. On the other hand, the magnetic head 2 is driven by a driving circuit 3 to generate a bias magnetic field modulated according to recording information, and applies the bias magnetic field to the temperature-increased portion of the recording layer 1a. Thus, the direction of magnetization of the temperature-increased portion on the recording layer 1a is oriented in the direction of the bias magnetic field, and an information pit is recorded on the recording layer 1a. Recently, in order to attain a higher information recording density, a pit recording method tends to transition from a pit position recording method for forming a significant information portion at the central position of a pit to a pit edge recording method for forming a significant information portion at the edge position of a pit. In the pit edge recording method, the edge of an information pit must be clearly recorded. For this purpose, it is required to increase the inversion speed of the bias magnetic field generated by the magnetic head in the recording mode.

As a driving device for the magnetic head, which can satisfy the above requirement, a device disclosed in, e.g., Japanese Laid-Open Patent Application No. 63-94406 is known. FIG. 2 is a circuit diagram showing the driving device. The device shown in FIG. 2 includes an excitation coil $C_h$ for generating the bias field of the magnetic head 2, and auxiliary coils L1 and L2 for switching the magnetic field at high speed. The device also includes switch elements S1 and S2 for switching the direction of a current flowing through the excitation coil $C_h$, and resistors R1 and R2 for limiting current. The inductances of the auxiliary coils L1 and L2 are set to be sufficiently larger than that of the excitation coil $C_h$. In this driving device, when the switch elements S1 and S2 are controlled to be alternately turned on so as to switch the direction of a current flowing through the excitation coil $C_h$, the polarity of the generated magnetic field is switched according to recording information. More specifically, when the switch element S1 is ON, and the switch element S2 is OFF, current paths CH1 and CH4 are conducted, and current paths CH2 and CH3 indicated by broken lines are interrupted. At this time, since a current is supplied to the excitation coil $C_h$ upon conduction of the current path CH1, the coil $C_h$ generates a magnetic field corresponding to the direction of the current. On the other hand, when the switch element S1 is OFF, and the switch element S2 is ON, the current paths CH2 and CH3 are conducted, and the current paths CH1 and CH4 are interrupted. As a result, a current in a direction opposite to that described above is supplied to the excitation coil $C_h$ upon conduction of the current path CH2, and the coil $C_h$ generates a magnetic field having an inverted polarity. Since the inductances of the auxiliary coils L1 and L2 are sufficiently larger than that of the excitation coil $C_h$, although the current paths are switched from CH1 to CH3 and from CH4 to CH2 before and after the ON/OFF operations of the switch elements S1 and S2, flowing currents maintain an almost constant value. For this reason, when the ON/OFF times of the switch elements S1 and S2 are sufficiently shortened, the direction of a current flowing through the excitation coil $C_h$ can be inverted in a very short period of time without increasing a voltage of a DC power supply V.

However, in practice, even when the switch element is turned off, if the switch element comprises, e.g., a field effect transistor, since a stray capacitance is present in its drain-source path, a vibration phenomenon is caused by this stray capacitance component and the inductance component of the excitation coil $C_h$. Thus, the current inversion time of the excitation coil $C_h$ is determined by the period of the vibration. Such a current vibration phenomenon is gradually attenuated since its energy is consumed in the process of vibration. In order to attenuate the current vibration more quickly, a damping resistor $R_d$ is normally connected in parallel with the excitation coil $C_h$, as shown in FIG. 2.

In the conventional magnetic head driving device shown in FIG. 2, the current inversion time of the excitation coil is undesirably determined by the vibration period defined by the stray capacitance around the switch element, and the inductance of the excitation coil. For this reason, in order to further shorten the current inversion time, the stray capacitance around the switch element and the inductance of the excitation coil must be decreased. However, when the switch element comprises a field effect transistor, the smaller the drain-source path capacitance becomes, the smaller the maximum rated current of the drain current becomes. Therefore, a decrease in stray capacitance is limited by the current value of the excitation coil. When the inductance is decreased by decreasing the number of turns of the excitation coil, a sufficient magnetic field strength cannot be obtained, and a decrease in inductance is also limited. In this manner, in the conventional device, it is difficult to further shorten the current inversion time of the excitation coil by merely decreasing the stray capacitance and the inductance.

SUMMARY OF THE INVENTION

The present invention has been made in consideration of the above situation, and has as its object to provide a magnetic head driving device, which can easily shorten the current inversion time of an excitation coil of a magnetic head, and can satisfy a high-speed inversion requirement of a bias field in the pit edge recording method.

In order to achieve the above object of the present invention, there is provided a magnetic head driving device for modulating a magnetic field generated by a magnetic head according to an information signal by switching a current direction of a magnetic field generation coil of the magnetic head in correspondence with the information signal, characterized in that an acceleration coil for shortening a current inversion time of the coil is connected in parallel with the magnetic field generation coil.

In order to achieve the above object of the present invention, there is also provided a magnetic head driving device for modulating a magnetic field generated by a magnetic head according to an information signal by switching a direction of a current to be supplied to a magnetic field generation coil provided to a core of the magnetic head in correspondence with the information signal, characterized in that an acceleration coil for shortening an inversion time of the current to be supplied to the magnetic field generation coil is connected to a secondary coil provided to the core of the magnetic head together with the magnetic field generation coil.

In order to achieve the above object of the present invention, there is also provided a magnetic head driving device for modulating a magnetic field generated by a magnetic head according to an information signal by switching a current direction of a magnetic field generation coil of the magnetic head in correspondence with the information signal, characterized in that an acceleration coil for shortening a current inversion time of the coil is connected between the two terminals of the magnetic field generation coil and a DC voltage source or ground.

DETAILED DESCRIPTION OF THE PREFERRED EMBODIMENTS

Figure 1:
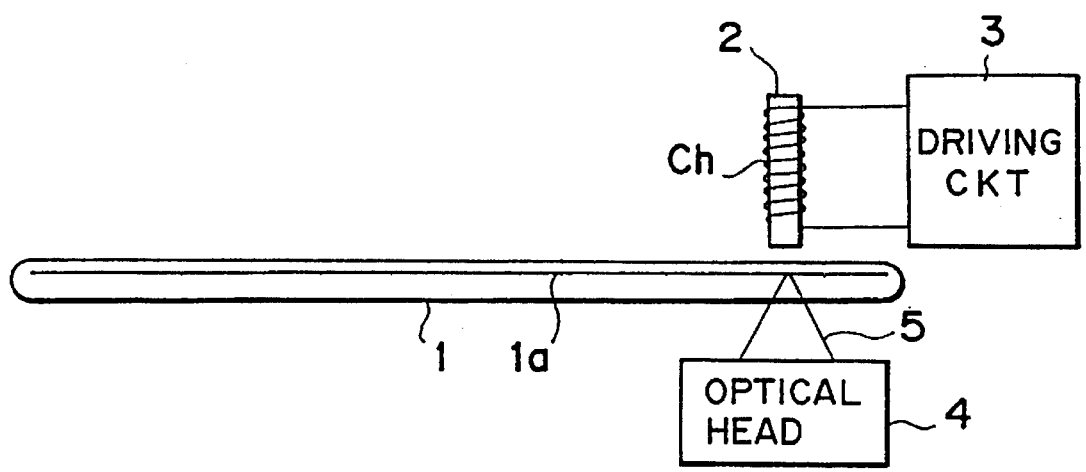
FIG. 1 is a schematic view showing an arrangement of a magnetooptical recording apparatus of a magnetic field modulation type.

The preferred embodiments of the present invention will be described in detail hereinafter with reference to the accompanying drawings. FIG. 3 shows the most basic circuit arrangement of a magnetic head driving device according to the present invention. The same reference numerals in FIG. 3 denote the same parts as in the conventional device shown in FIG. 2. The device shown in FIG. 3 includes an excitation coil $C_h$ constituting a magnetic head, and auxiliary coils L1 and L2 having inductances sufficiently larger than that of the excitation coil $C_h$. The device also includes current limiting resistors R1 and R2 for the excitation coil $C_h$, and switch elements S1 and S2 for switching the current direction of the excitation coil $C_h$. The switch elements S1 and S2 comprise field effect transistors. An acceleration coil L3 is connected in parallel with the excitation coil $C_h$.

The magnetic head driving device of the present invention shown in FIG. 3 is used in the magnetooptical recording apparatus of the magnetic field modulation type described above with reference to FIG. 1.

The operation of this embodiment will be described below. Basically, when the switch elements S1 and S2 are alternately turned on, the current direction of the excitation coil $C_h$ is switched in correspondence with an information signal as in the conventional device. Thus, the magnetic head generates a magnetic field corresponding to the current direction of the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L3, and the stray capacitance of the switch element. For example, when the drain-source path capacitance when the field effect transistor as the switch element is OFF is represented by $C_F$, the inductance of the excitation coil $C_h$ is represented by $L_h$, and the inductance of the acceleration coil L3 is represented by $L_K$, a synthesized inductance L of the excitation coil $C_h$ and the acceleration coil L3 is given by:

$$L = L_h \cdot L_K / (L_h + L_K) \quad (1)$$

An inversion time t of a current supplied to the excitation coil $C_h$ at that time is given by:

$$t = \pi \sqrt{L C_F} \quad (2)$$

Figure 2:
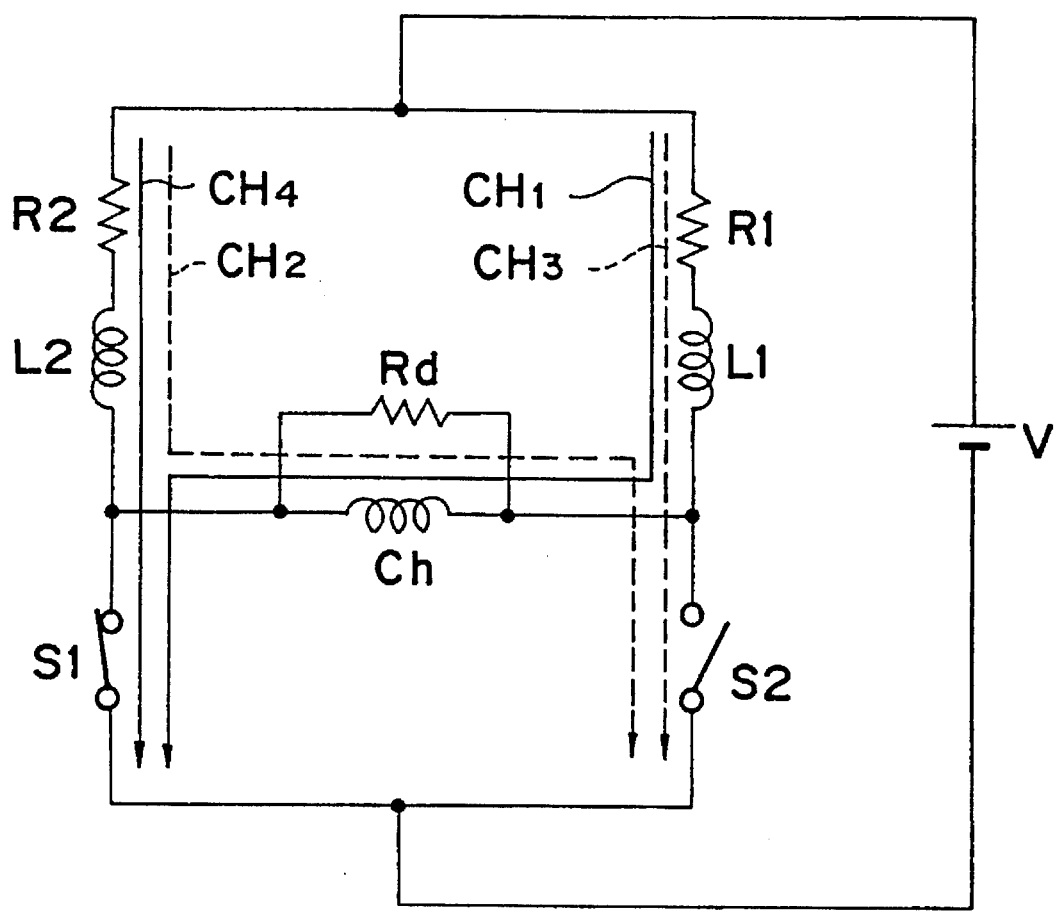
FIG. 2 is a circuit diagram showing a conventional magnetic head driving device.
Figure 3:
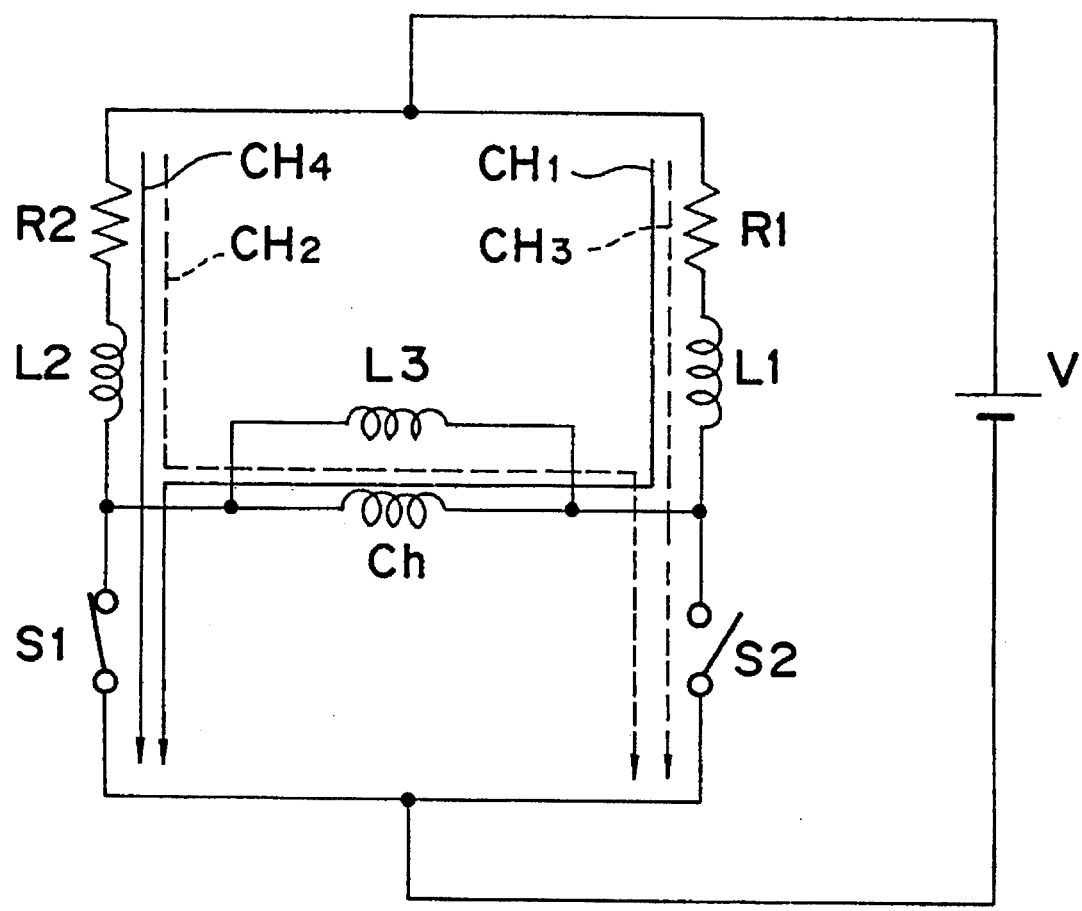
FIG. 3 is a circuit diagram showing an embodiment of a magnetic head driving device according to the present invention.

In contrast to this, since the conventional magnetic head driving device shown in FIG. 2 does not have an acceleration coil L3, a current inversion time t' of the excitation coil $C_h$ is given by:

$$t' = \pi \sqrt{L_h C_F} \quad (3)$$

Since L and $L_h$ satisfy $L < L_h$, a relation $t < t'$ is established, and as is understood from the above description, the current inversion time t of this embodiment is shorter than the conventional inversion time t'.

In this manner, according to the magnetic head driving device of the present invention, the inversion time of a current supplied to the excitation coil $C_h$ can be made shorter than that of the conventional device, and the inversion speed of a magnetic field generated by the magnetic head can be increased. Therefore, the present invention can satisfy the requirement for increasing the inversion speed of a bias magnetic field in the pit edge recording method, and can remarkably contribute to a high recording density as a merit of the pit edge recording method.

In the above-mentioned embodiment, since the acceleration coil L3 is connected in parallel with the excitation coil $C_h$, some components of current to be originally supplied to the excitation coil $C_h$ may flow into the acceleration coil L3. As a result, since the current to be supplied to the excitation coil $C_h$ is decreased, signal recording may be disturbed. In order to avoid such a situation, a means for effectively blocking current flowing into the acceleration coil L3 can be provided. Another embodiment having such a means will be described below.

Magnetic head driving devices according to the present invention shown in FIGS. 4 to 14 are used in the magnetooptical recording apparatus of the magnetic field modulation type described above with reference to FIG. 1.

Figure 4:
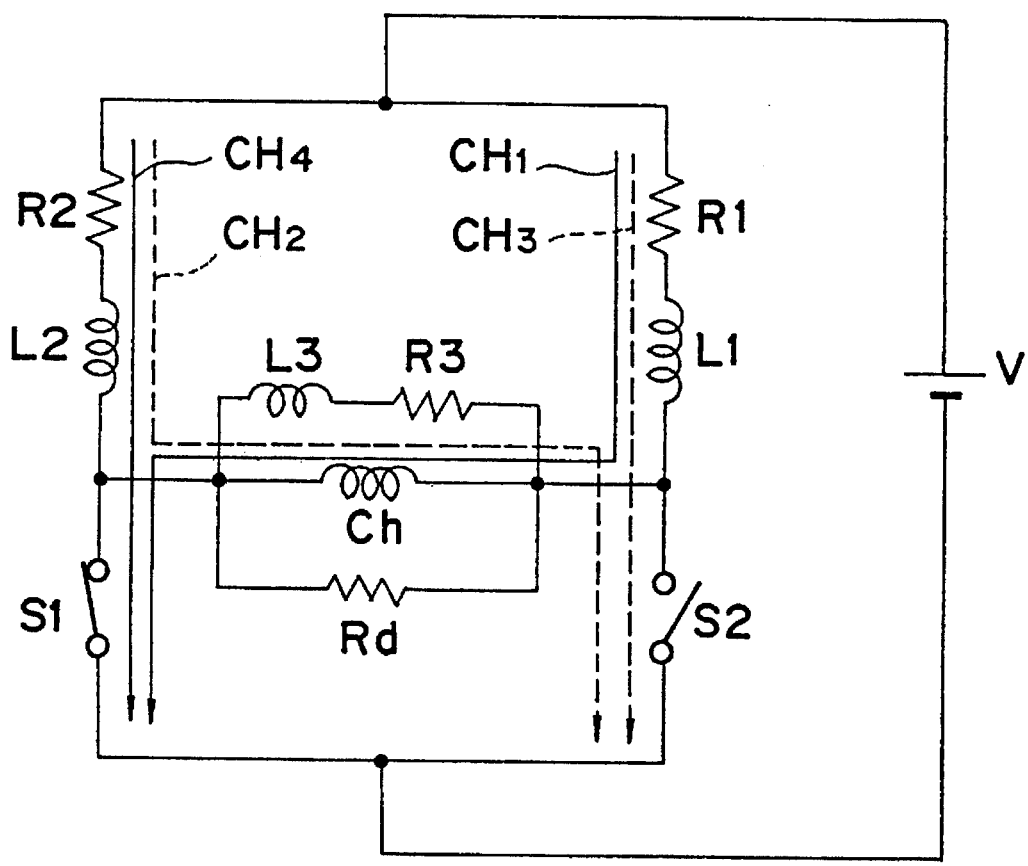
FIG. 4 is a circuit diagram showing another embodiment of a magnetic head driving device according to the present invention.
Figure 5:
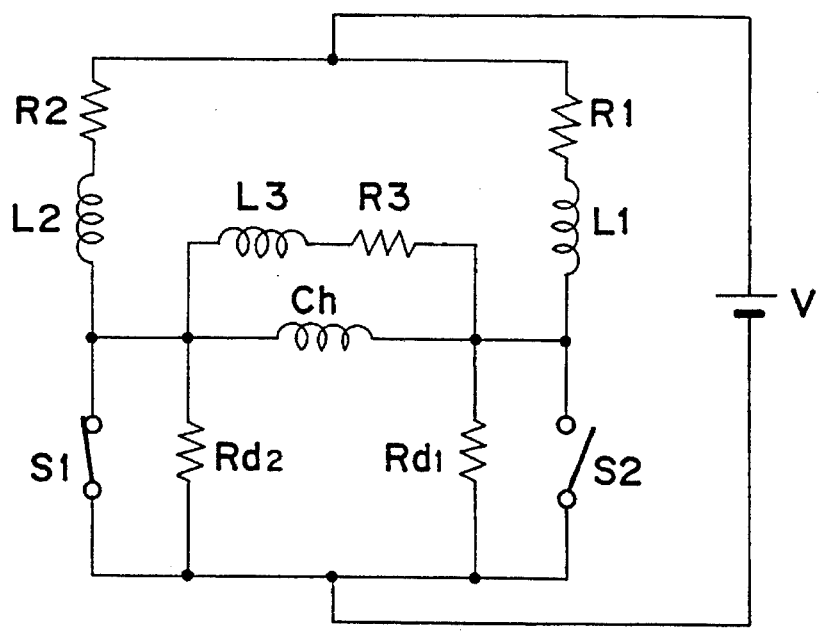
FIG. 5 is a circuit diagram showing another example of a damping resistor.
Figure 6:
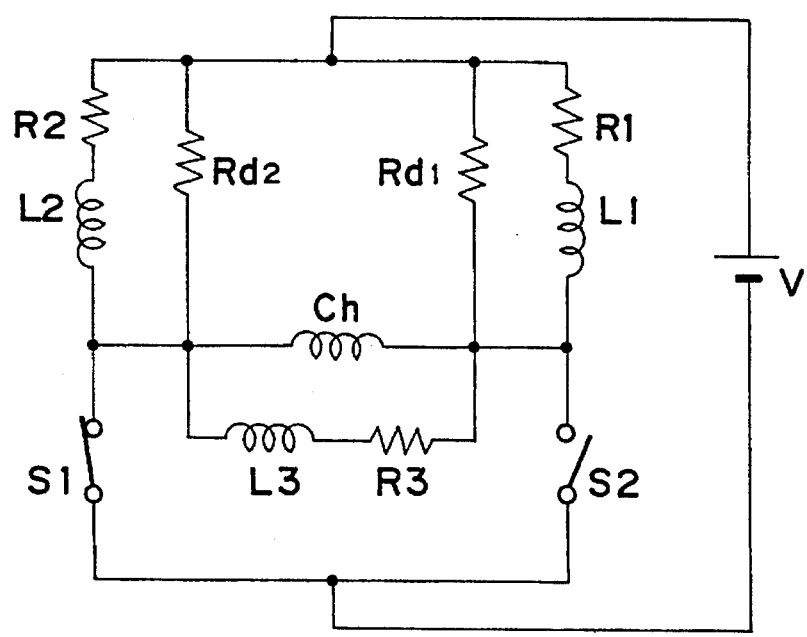
FIG. 6 is a circuit diagram showing still another example of a damping resistor.
Figure 7:
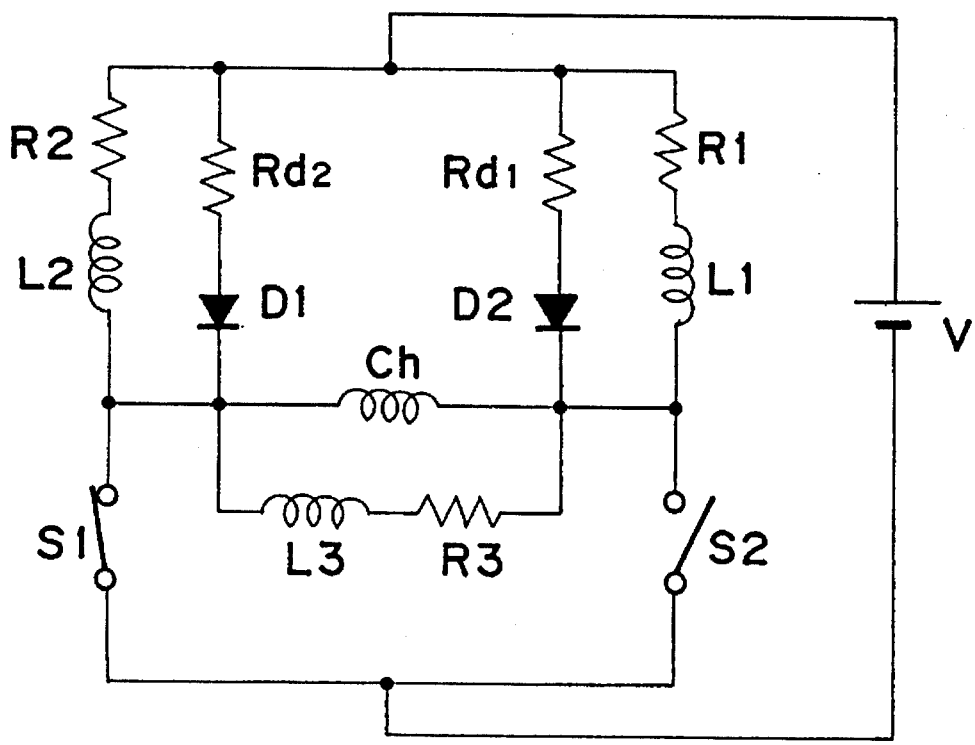
FIG. 7 is a circuit diagram showing still another example of a damping resistor.

FIG. 4 is a circuit diagram showing another embodiment of a magnetic head driving device according to the present invention. Note that the same reference numerals in FIG. 4 denote the same parts as in the conventional device shown in FIG. 2. The device shown in FIG. 4 includes an excitation coil $C_h$ constituting a magnetic head, and auxiliary coils L1 and L2 having inductances sufficiently larger than that of the excitation coil $C_h$. The device also includes current limiting resistors R1 and R2 for the excitation coil $C_h$, a damping resistor $R_d$, and switch elements S1 and S2 for switching the current direction of the excitation coil $C_h$. The switch elements S1 and S2 comprise field effect transistors. An acceleration coil L3 and its current limiting resistor R3 are connected in parallel with the excitation coil $C_h$. As has been described in detail above, the acceleration coil L3 has a function of shortening the current inversion time of the excitation coil $C_h$ to shorten the inversion time of the magnetic field. Note that the damping resistor $R_d$ need not always be connected in parallel with the excitation coil, as shown in FIG. 4. For example, two damping resistors $R_{d1}$ and $R_{d2}$ may be connected between the two terminals of the excitation coil $C_h$ and ground, as shown in FIG. 5, or may be connected between the two terminals of the excitation coil $C_h$ and a power supply, as shown in FIG. 6. Furthermore, as shown in FIG. 7, the two damping resistors $R_{d1}$ and $R_{d2}$ may be connected between the power supply and the two terminals of the excitation coil $C_h$ via diodes D1 and D2. The diodes D1 and D2 are used for shaping a current waveform by more effectively attenuating the current vibration of the excitation coil $C_h$.

The operation of this embodiment will be described below. In a normal magnetic head driving operation, when the switch elements S1 and S2 are alternately turned on, the current direction of the excitation coil $C_h$ is switched in correspondence with an information signal as in the conventional device. Thus, the magnetic head generates a magnetic field corresponding to the current direction of the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L3, and the stray capacitance of the switch element. For example, when the drain-source path capacitance when the field effect transistor as the switch element is OFF is represented by $C_F$, the inductance of the excitation coil $C_h$ is represented by $L_h$, and the inductance of the acceleration coil L3 is represented by $L_K$, a synthesized inductance L of the excitation coil $C_h$ and the acceleration coil L3 is given by:

$$L = L_h \cdot L_K / (L_h + L_K) \qquad (4)$$

An inversion time t of a current supplied to the excitation coil $C_h$ at that time is given by:

$$t = \pi \sqrt{LC_F} \qquad (5)$$

In this case, the resistance of the resistor R3 preferably satisfies $R3 \leq 2\pi f L_K$ when the frequency of the current vibration, in other words, a frequency f associated with the current inversion is given by:

$$f = 1/2\pi \sqrt{LC_F} \qquad (6)$$

In contrast to this, since the conventional magnetic head driving device shown in FIG. 2 has neither the acceleration coil L3 nor the resistor R3, a current inversion time t' of the excitation coil $C_h$ is given by:

$$t' = \pi \sqrt{L_h C_F} \qquad (7)$$

Since L and $L_h$ satisfy $L < L_h$, a relation $t < t'$ is established, and as is understood from the above description, the current inversion time t of this embodiment is shorter than the conventional inversion time t'. Since the acceleration coil L3 is provided, the current supplied to the excitation coil $C_h$ may be decreased, as described above. In order to avoid this, the resistance of the resistor R3 is preferably set to satisfy $R3 \geq 2\pi f_r L_h$ (where $f_r$ is the frequency of a signal to be recorded).

Thus, at the frequency $f_r$ of a signal to be recorded, the resistor R3 dominantly acts to block a current flowing into the acceleration coil L3, and at the frequency f ($f > f_r$) associated with the current inversion, the inductance $L_K$ of the acceleration coil $L_3$ dominantly acts. As a result, the current inversion time can be shortened without decreasing a current supplied to the excitation coil $C_h$.

Figure 8:
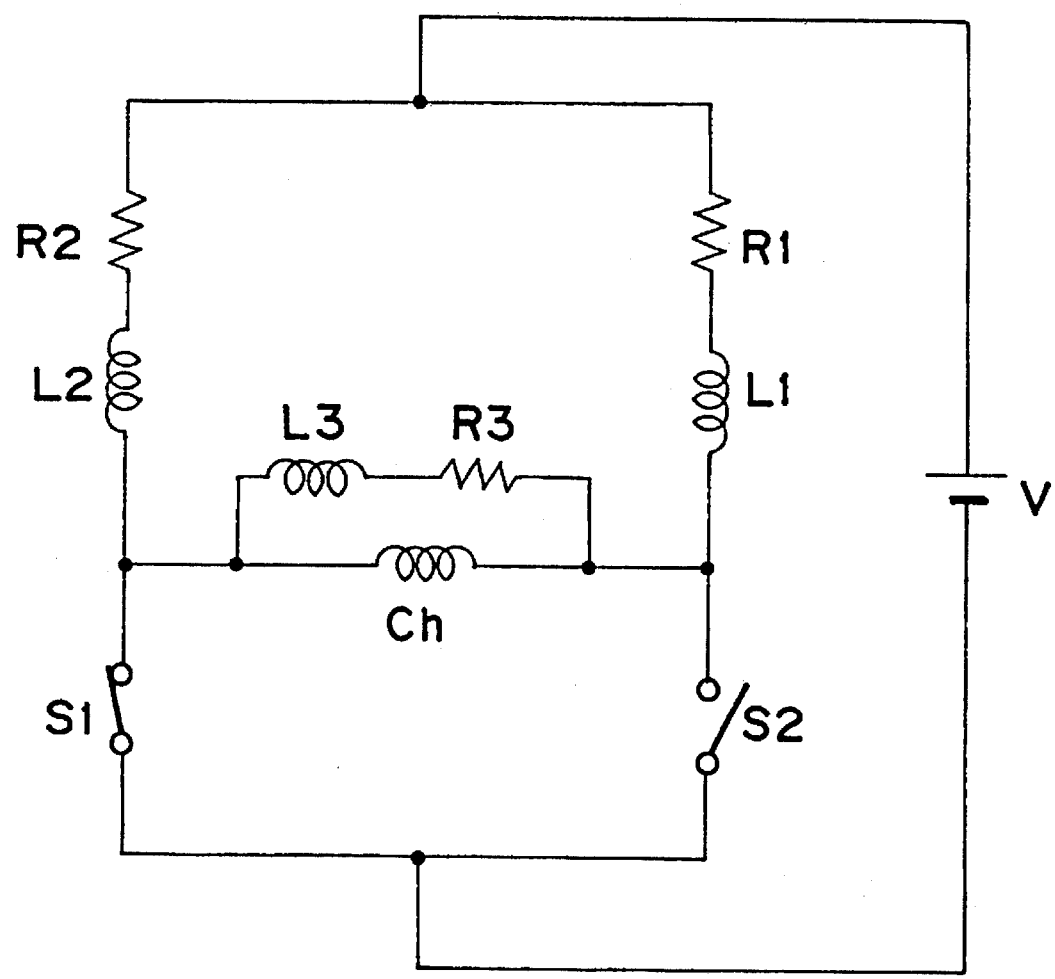
FIG. 8 is a circuit diagram showing an example excluding a damping resistor.

As described above, according to this embodiment, the inversion time of a current supplied to the excitation coil $C_h$ can be shortened as compared to the conventional device, and hence, the inversion time of a magnetic field generated by the magnetic head can be shortened. Therefore, this embodiment can satisfy the requirement for increasing the inversion speed of a bias magnetic field in the pit edge recording method, and can remarkably contribute to a high recording density as a merit of the pit edge recording method. The present inventors experimentally confirmed that the resistor R3 connected in series with the acceleration coil L3 also serves as a damping resistor, and has an effect of attenuating the current vibration of the excitation coil $C_h$ as well. Therefore, as shown in FIG. 8, the damping resistor $R_d$ may be omitted, so that the resistor R3 also serves as a damping resistor.

Figure 9:
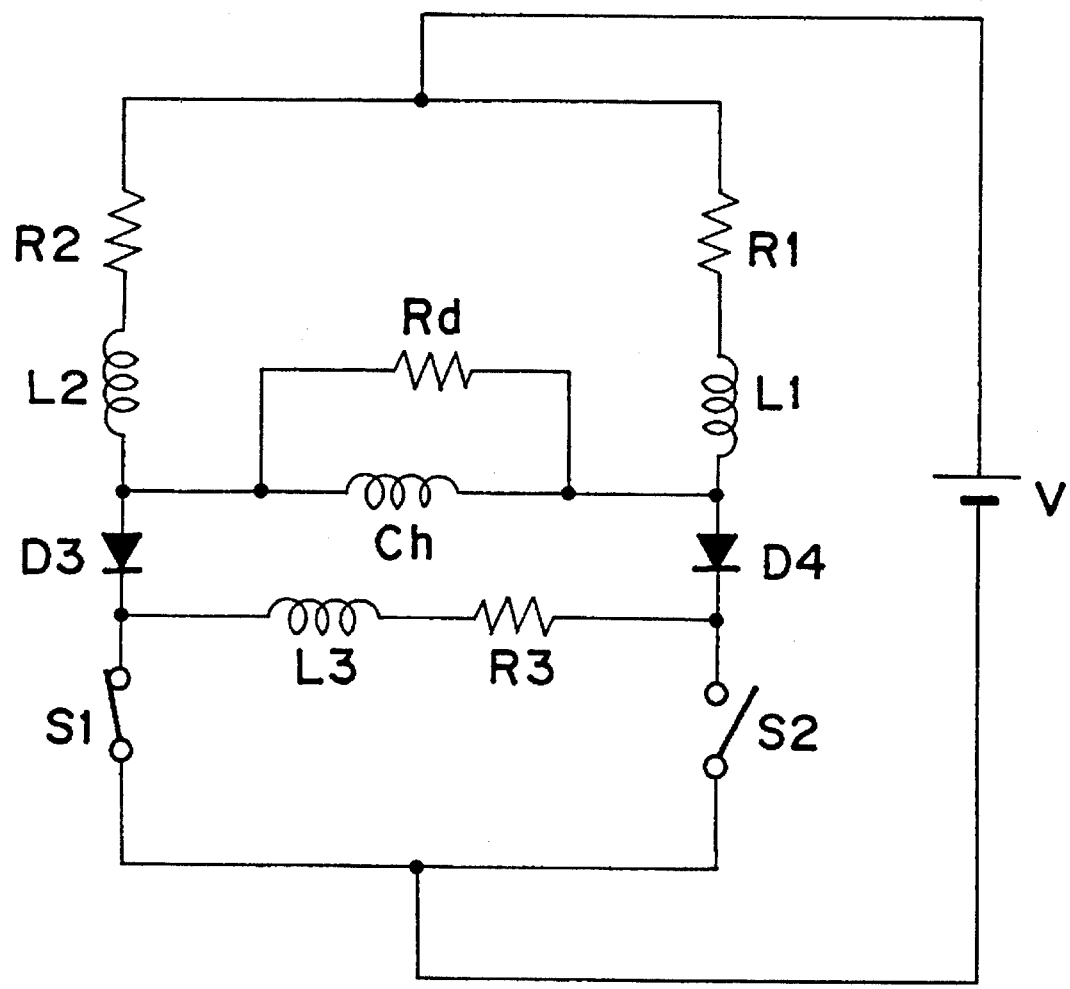
FIGS. 9 and 10 are circuit diagrams showing other embodiments of magnetic head driving devices according to the present invention.

For example, as shown in FIG. 9, diodes D3 and D4 may be connected between the excitation coil $C_h$ and the switch elements S1 and S2 for the purpose of preventing the reverse flow of a current from the switch elements S1 and S2 toward the excitation coil $C_h$ and improving settling characteristics upon current inversion. In this case, the acceleration coil L3 may be connected between the diode D3 and the switch element S1, and between the diode D4 and the switch element S2. Of course, the acceleration coil L3 may be directly connected in parallel with the two terminals of the excitation coil $C_h$ as in the above-mentioned embodiment, and the same effect can be expected in this case.

In this manner, according to the present invention, the acceleration coil need not always be directly connected between the two terminals of the excitation coil $C_h$, but need only be arranged at a position substantially in parallel with the excitation coil, thus obtaining a sufficient effect.

Figure 10:
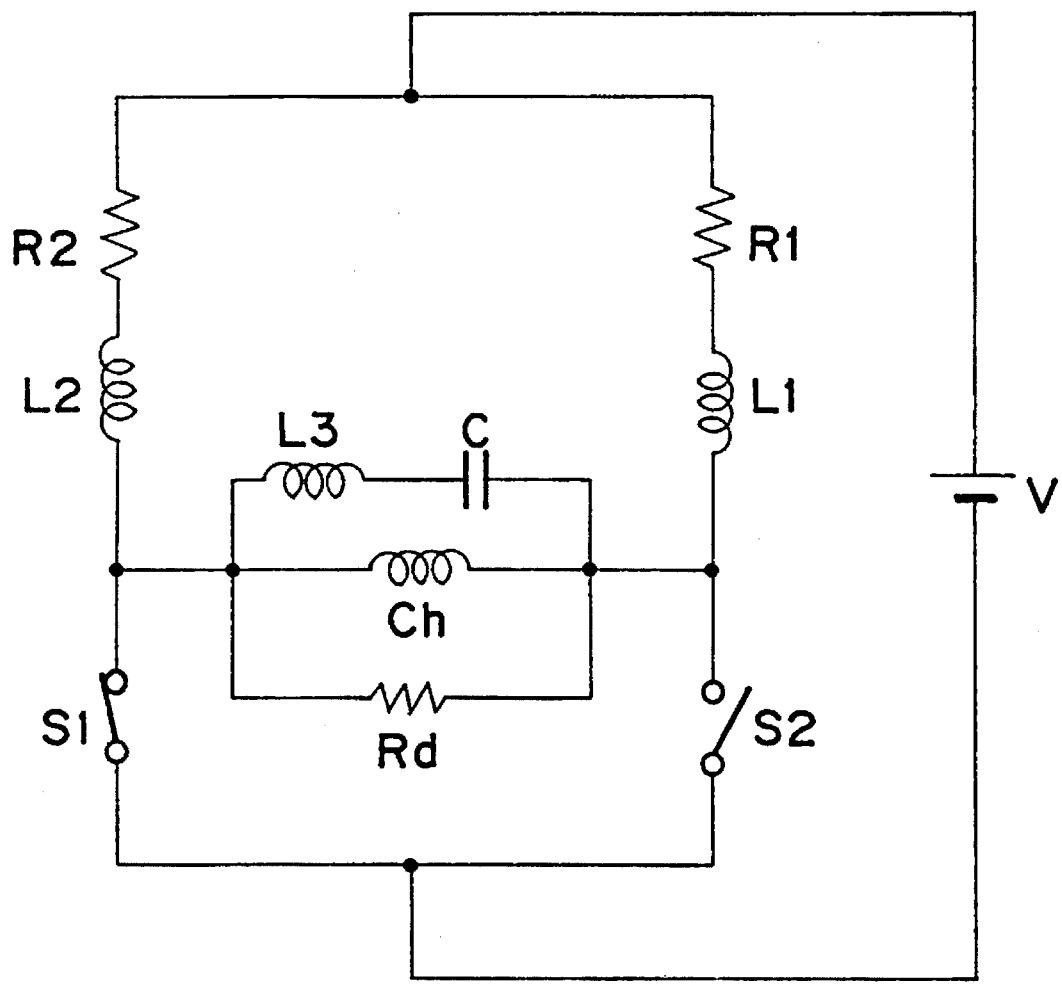
Figure 11:
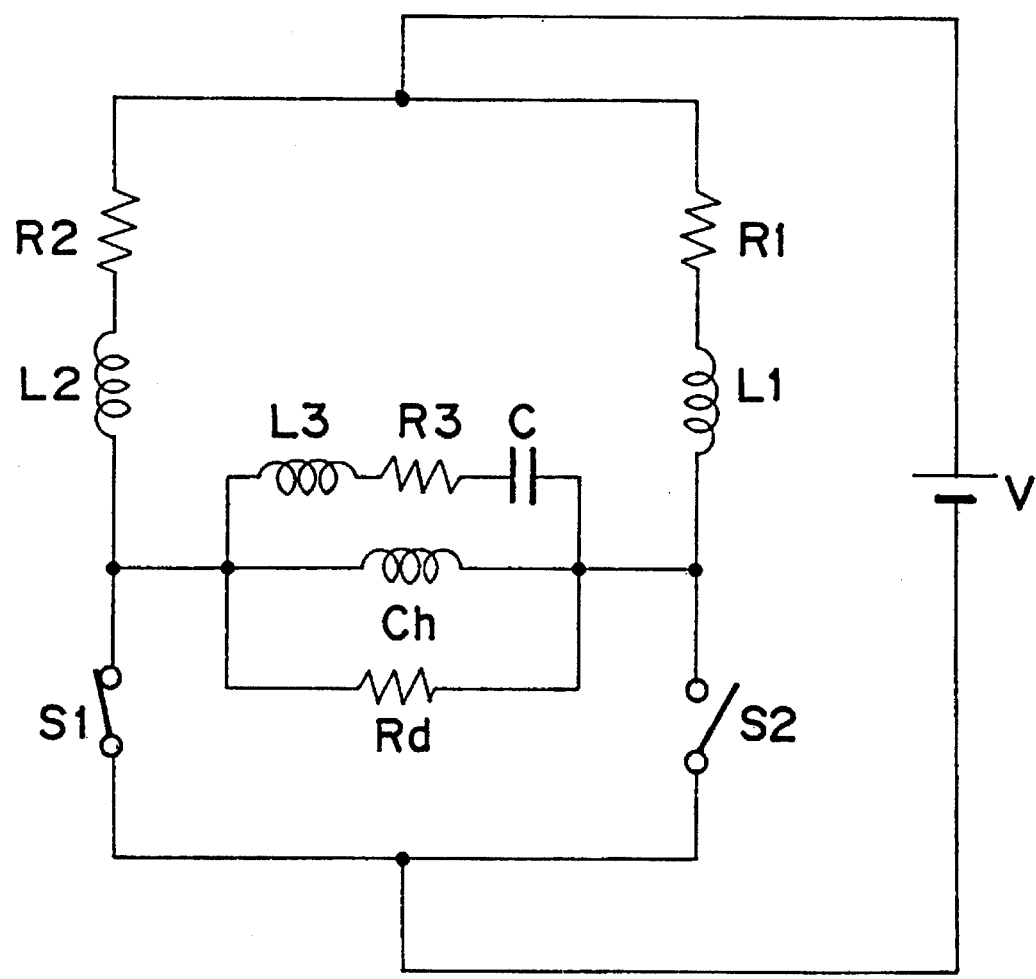
FIGS. 11 and 12 are circuit diagrams showing other embodiments of high-pass filters.
Figure 12:
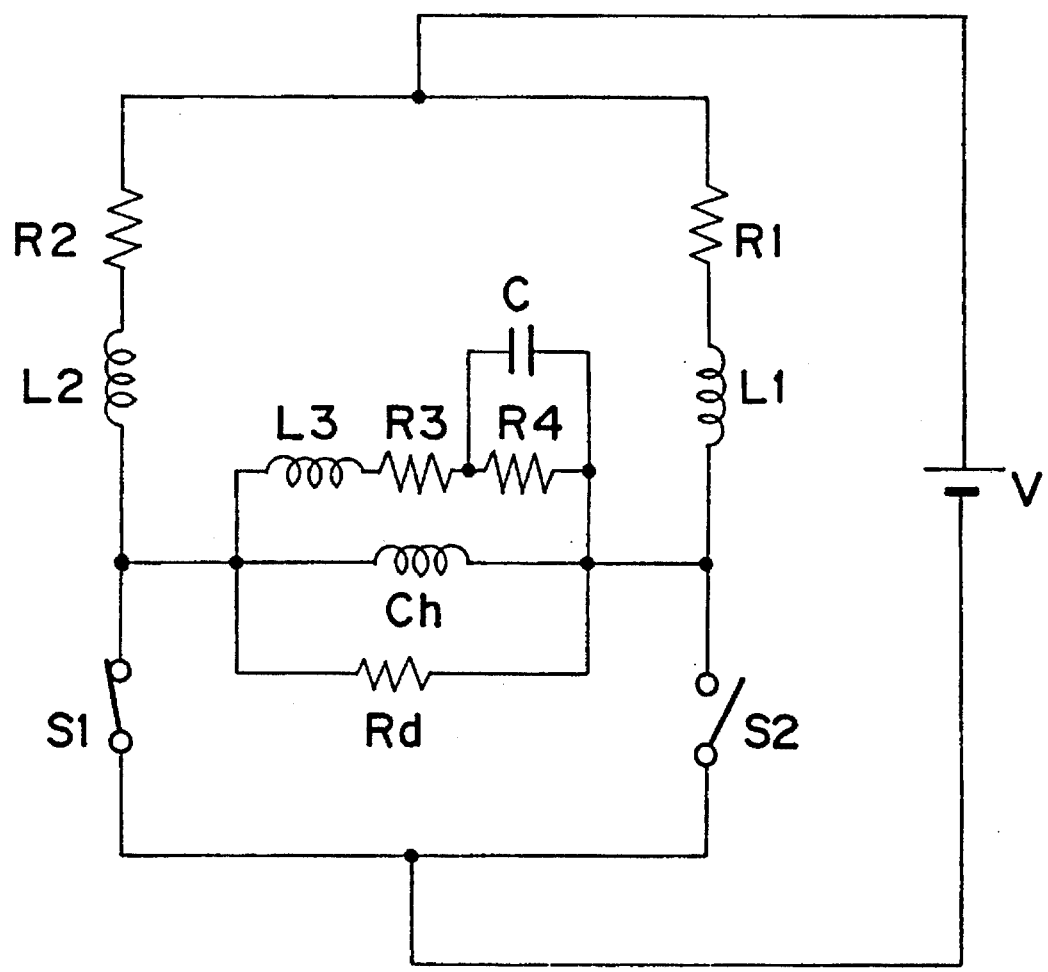

Other embodiments of a magnetic head driving device according to the present invention will be described below. FIGS. 10, 11, and 12 show embodiments of the present invention, which are characterized in that an element or circuit having high-frequency band pass characteristics, i.e., a high-pass filter is connected in series with an acceleration coil L3. The basic operations of these embodiments are the same as those in the above embodiments.

A capacitor C in FIG. 10, a resistor R3 and a capacitor C in FIG. 11, and resistors R3 and R4 and a capacitor C in FIG. 12 constitute high-pass filters connected in series with the acceleration coil L3. These high-pass filters are arranged to replace the current limiting resistor R3 in the above embodiment shown in FIGS. 4 to 9. In each of these high-pass filters, a current flowing into the acceleration coil L3 is blocked at the frequency $f_r$ of a signal to be recorded, and the inductance of the acceleration coil L3 effectively acts at the frequency f ($f > f_r$) associated with current inversion. Thus, these high-pass filters have as their object to consequently shorten the current inversion time without decreasing a current to be supplied to the excitation coil $C_h$ on the basis of the above-mentioned principle. In these embodiments, the above-mentioned object can be more effectively achieved by utilizing the high-frequency band pass characteristics of the high-pass filters in place of the current limiting resistor R3 in the above embodiment.

The high-pass filter can be designed to have effective frequency characteristics according to the frequency $f_r$ of a recording signal and the frequency f associated with the current inversion. The circuit arrangement of the high-pass filter is not limited to those of the above embodiments, but may be realized by various other circuit arrangements.

In the embodiments described above, the present invention is applied to the magnetic head driving device having auxiliary coils with sufficiently large inductances. However, the present invention can also be applied to other conventional magnetic head driving devices. Such an embodiment will be described below.

Figure 13:
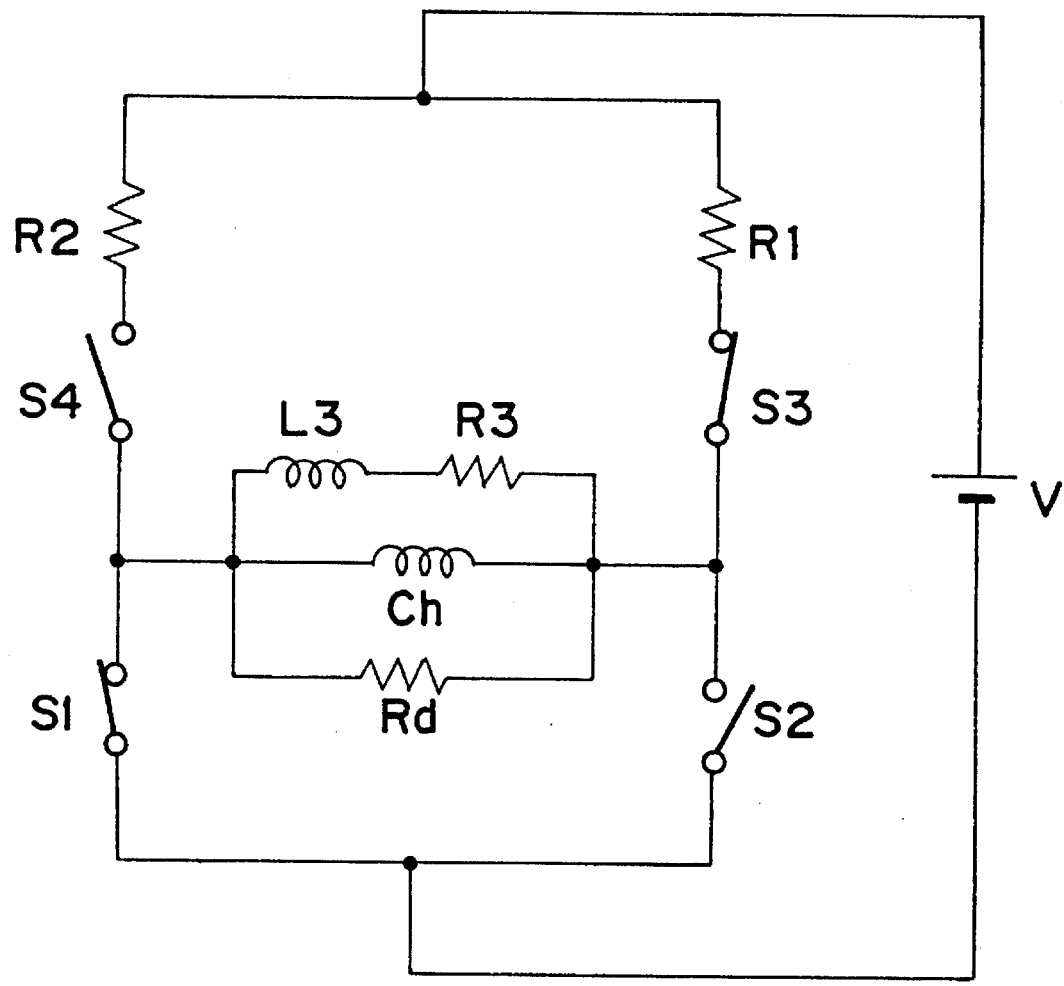
FIGS. 13 and 14 are circuit diagrams showing other embodiments of magnetic head driving devices according to the present invention.

FIG. 13 shows a magnetic head driving circuit for supplying a current to an excitation coil $C_h$ by a bridge circuit using four switch elements S1, S2, S3, and S4. In this embodiment, the switch elements S1 and S3, and the switch elements S2 and S4 are alternately turned on/off according to recording information, thereby alternately inverting a current supplied to the excitation coil $C_h$. In this embodiment, when an acceleration coil L3 is connected in parallel with the excitation coil $C_h$, the current inversion time can be shortened as in the above embodiments. In the embodiment shown in FIG. 13, a current limiting resistor R3 is connected in series with the acceleration coil L3, and a damping resistor $R_d$ is connected in parallel with the excitation coil $C_h$. In addition, the circuit arrangements shown in FIGS. 5 to 12 in the above embodiment may be adopted.

Figure 14:
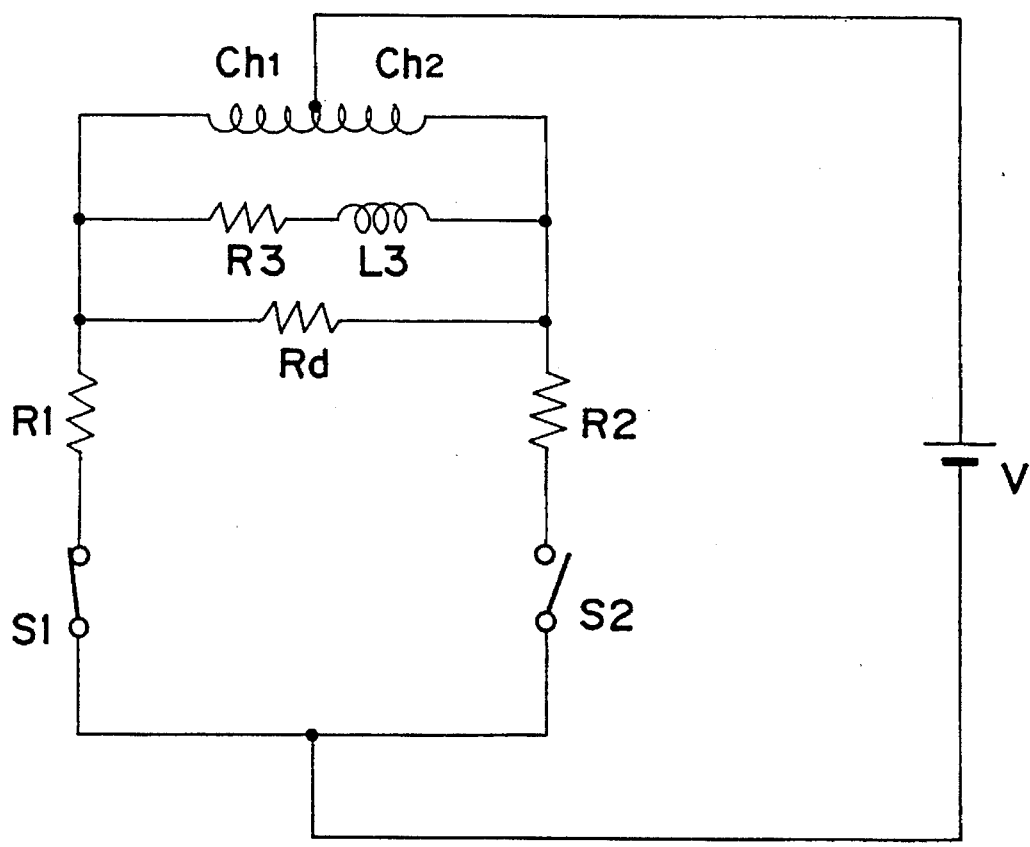

FIG. 14 shows an embodiment wherein two excitation coils $C_{h1}$ and $C_{h2}$ are provided to a magnetic head, and currents in different directions are alternately supplied to the excitation coils $C_{h1}$ and $C_{h2}$, thereby inverting a bias magnetic field. In this embodiment as well, when an acceleration coil L3 is connected in parallel with the excitation coils $C_{h1}$ and $C_{h2}$ as in the above embodiment, the rising and falling times of currents supplied to the excitation coils $C_{h1}$ and $C_{h2}$ can be shortened. As a result, the inversion time of the bias magnetic field can be shortened. In the embodiment shown in FIG. 14, a current limiting resistor R3 is connected in series with the acceleration coil L3, and a damping resistor $R_d$ is connected in parallel with the excitation coils $C_{h1}$ and $C_{h2}$. In addition, various other circuit arrangements shown in FIGS. 5 to 12 in the above embodiment may be adopted.

In the embodiments described above of the present invention, since the acceleration coil is connected in parallel with the excitation coil, the current inversion time of the excitation coil can be shortened, and hence, the magnetic field inversion time of the magnetic head can be shortened. Therefore, each of the above-mentioned magnetic head driving devices can be suitably applied to a magnetic head driving device for the pit edge recording method, which requires high-speed inversion of a bias magnetic field. When such a device is used in the magnetooptical recording apparatus of the magnetic field modulation type, it can remarkably contribute to an increase in information recording density.

Figure 15:
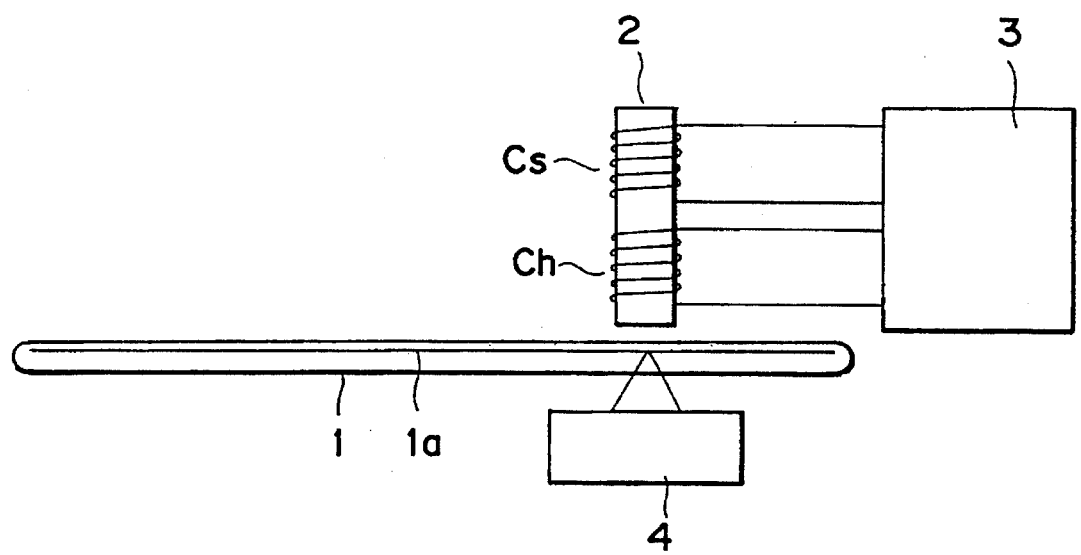
FIG. 15 is a schematic view showing an arrangement of a magnetooptical recording apparatus of a magnetic field modulation type according to the present invention.
Figure 16:
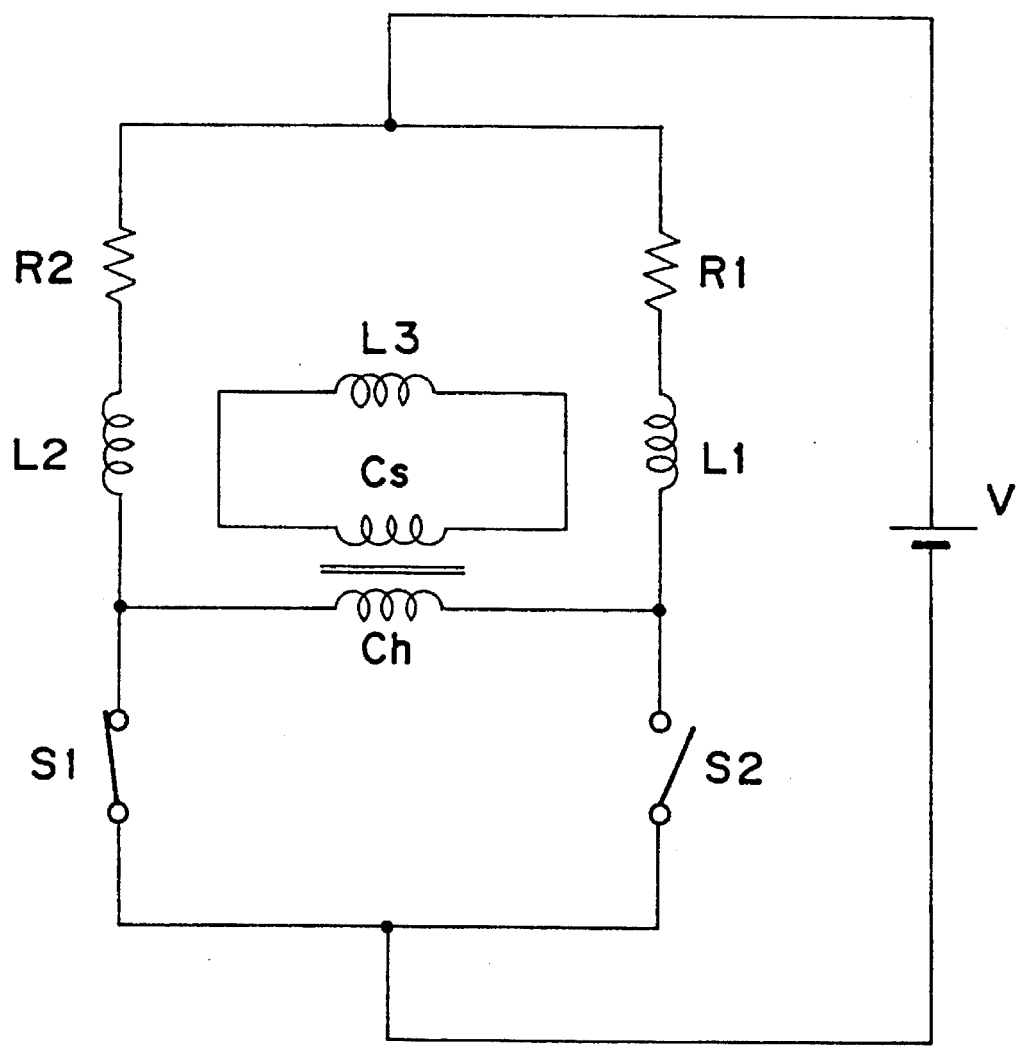
FIGS. 16 to 27 are circuit diagrams showing other embodiments of magnetic head driving devices according to the present invention.

Still another embodiment of the present invention will be described in detail hereinafter with reference to the accompanying drawings. FIG. 15 shows the overall arrangement of a magnetooptical recording apparatus of a magnetic field modulation type according to the present invention. The basic arrangement of the apparatus is the same as that shown in FIG. 1. In the apparatus shown in FIG. 15, a secondary coil $C_s$ is provided to a core of a magnetic head 2 together with an excitation coil $C_h$ for generating a magnetic field. FIG. 16 shows the most basic circuit arrangement of a magnetic head driving circuit according to the present invention used in the apparatus shown in FIG. 15. The same reference numerals in FIG. 16 denote the same parts as in the conventional device shown in FIG. 2. The device shown in FIG. 16 includes an excitation coil $C_h$ constituting a magnetic head, and auxiliary coils L1 and L2 having inductances sufficiently larger than that of the excitation coil $C_h$. The device also includes current limiting resistors R1 and R2 for the excitation coil $C_h$, and switch elements S1 and S2 for switching the current direction of the excitation coil $C_h$. The switch elements S1 and S2 comprise, e.g., field effect transistors. The secondary coil $C_s$ is provided to the core of the magnetic head together with the excitation coil $C_h$. An acceleration coil L3 for accelerating inversion of a current supplied to the excitation coil $C_h$ is connected to the secondary coil $C_s$.

The operation of this embodiment will be described below. In the basic operation, when the switch elements S1 and S2 are alternately turned on/off, the direction of a current supplied to the excitation coil $C_h$ is switched in correspondence with an information signal. Thus, the magnetic head generates a magnetic field corresponding to the direction of the current supplied to the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L3 connected via the secondary coil $C_s$, and the stray capacitance of the switch element. For example, when the inductances of each of the excitation coil $C_h$ and the secondary coil $C_s$ is represented by $L_h$, the two coils have a coupling coefficient=1, the inductance of the acceleration coil L3 is represented by $L_K$, and the drain-source path capacitance when the field effect transistor as the switch element is OFF is represented by $C_F$, a synthesized inductance L of the excitation coil $C_h$ and the acceleration coil L3 is given by:

$$L = L_h \cdot L_K / (L_h + L_K) \tag{8}$$

An inversion time t of a current supplied to the excitation coil $C_h$ at that time is given by:

$$t = \pi \sqrt{L \cdot C_F} \tag{9}$$

In contrast to this, since the conventional magnetic head driving device does not have an acceleration coil L3, a current inversion time t' of the excitation coil $C_h$ is given by:

$$t' = \pi \sqrt{L_h \cdot C_F} \tag{10}$$

As is apparent from equation (8), since L and $L_h$ satisfy $L<L_h$, a relation t<t' is established. In this manner, the current inversion time of this embodiment is shortened as compared to that of the conventional device. Therefore, since the inversion time of a bias magnetic field generated by the magnetic head is shortened, this embodiment can satisfy the requirement for increasing the bias magnetic field inversion speed in the pit edge recording method, and can remarkably contribute to a high recording density as a merit of the pit edge recording method.

In the above embodiment, since the acceleration coil L3 is connected to the secondary coil $C_s$ provided to the core of the magnetic head together with the excitation coil $C_h$, a current induced in the secondary coil $C_s$ upon a change in current of the excitation coil $C_h$ acts in a direction to decrease the magnetic field generated by the magnetic head, and satisfactory signal recording may be disturbed. In order to avoid such a situation, a means for effectively blocking a current induced in the secondary coil $C_s$ can be arranged. Another embodiment having such a means will be described below.

Magnetic head driving devices according to the present invention shown in FIGS. 17 to 26 are used in the magnetooptical recording apparatus of the magnetic field modulation type described above with reference to FIG. 15.

Figure 17:
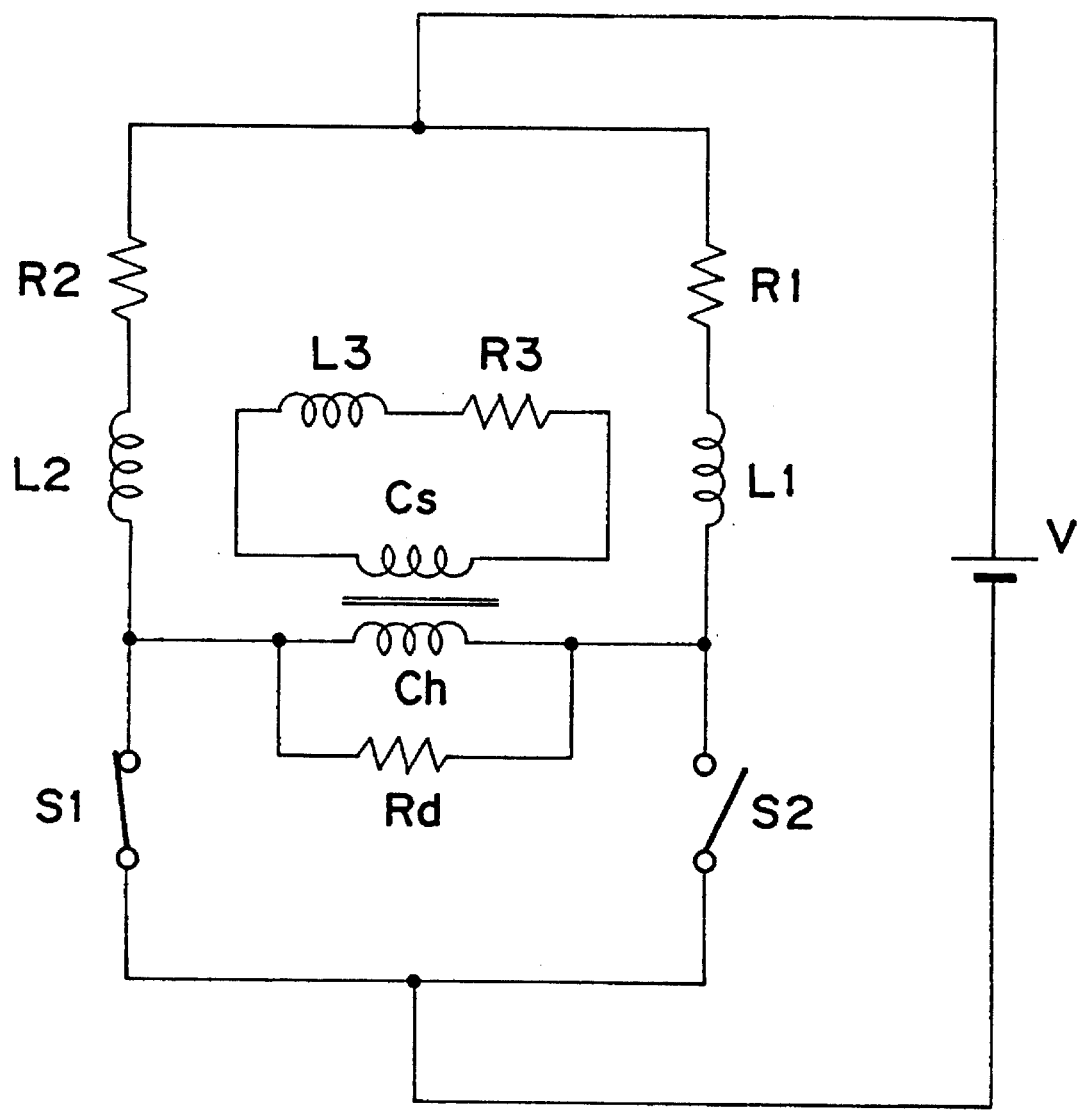
Figure 18:
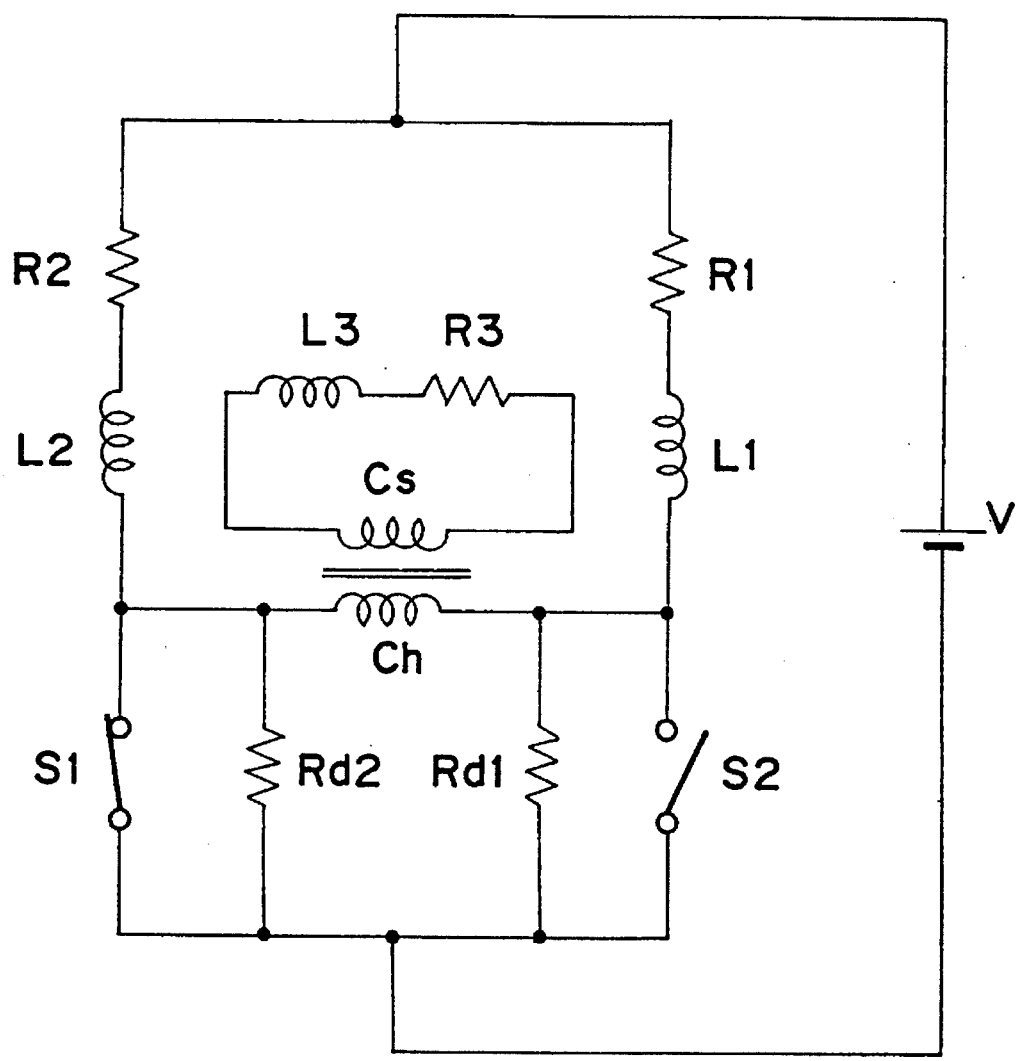
Figure 19:
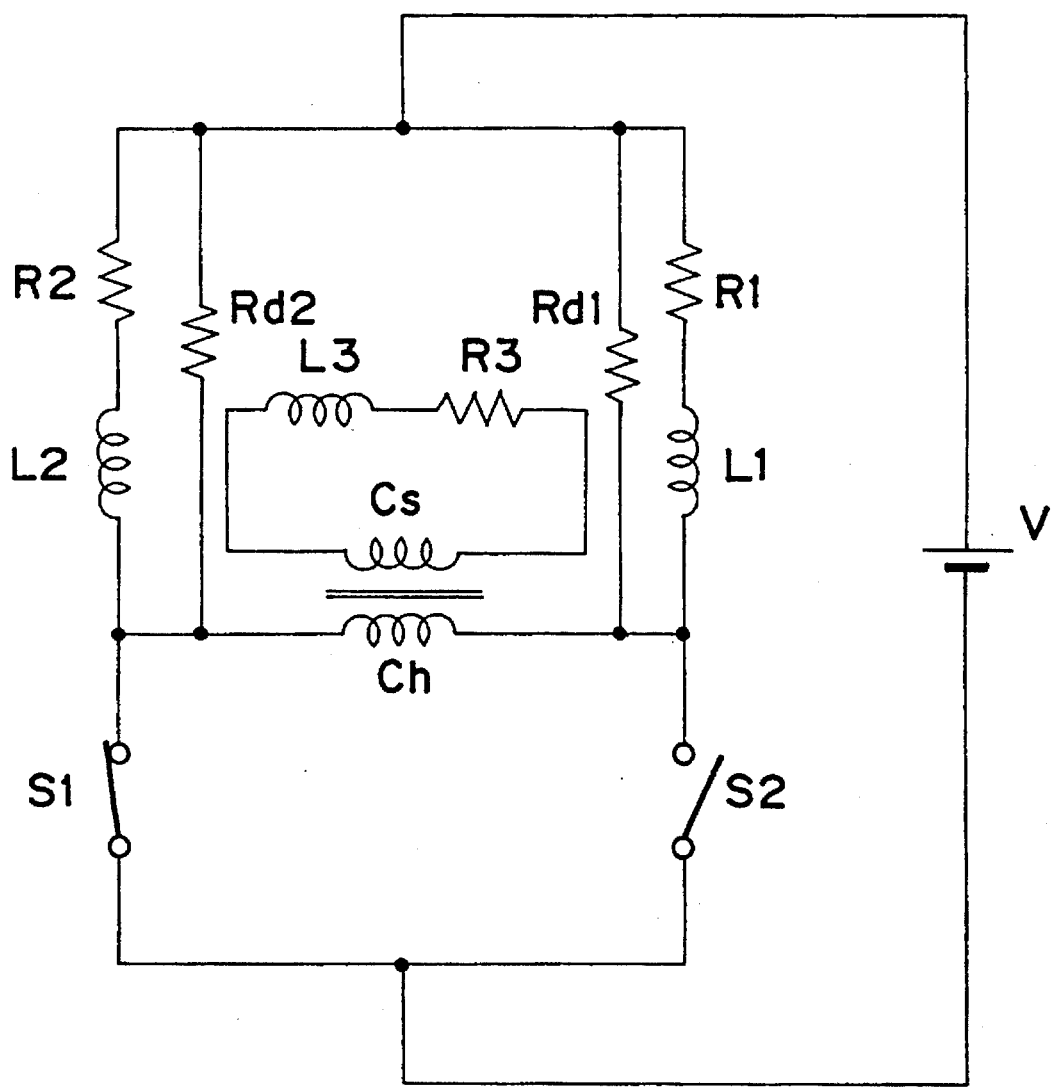
Figure 20:
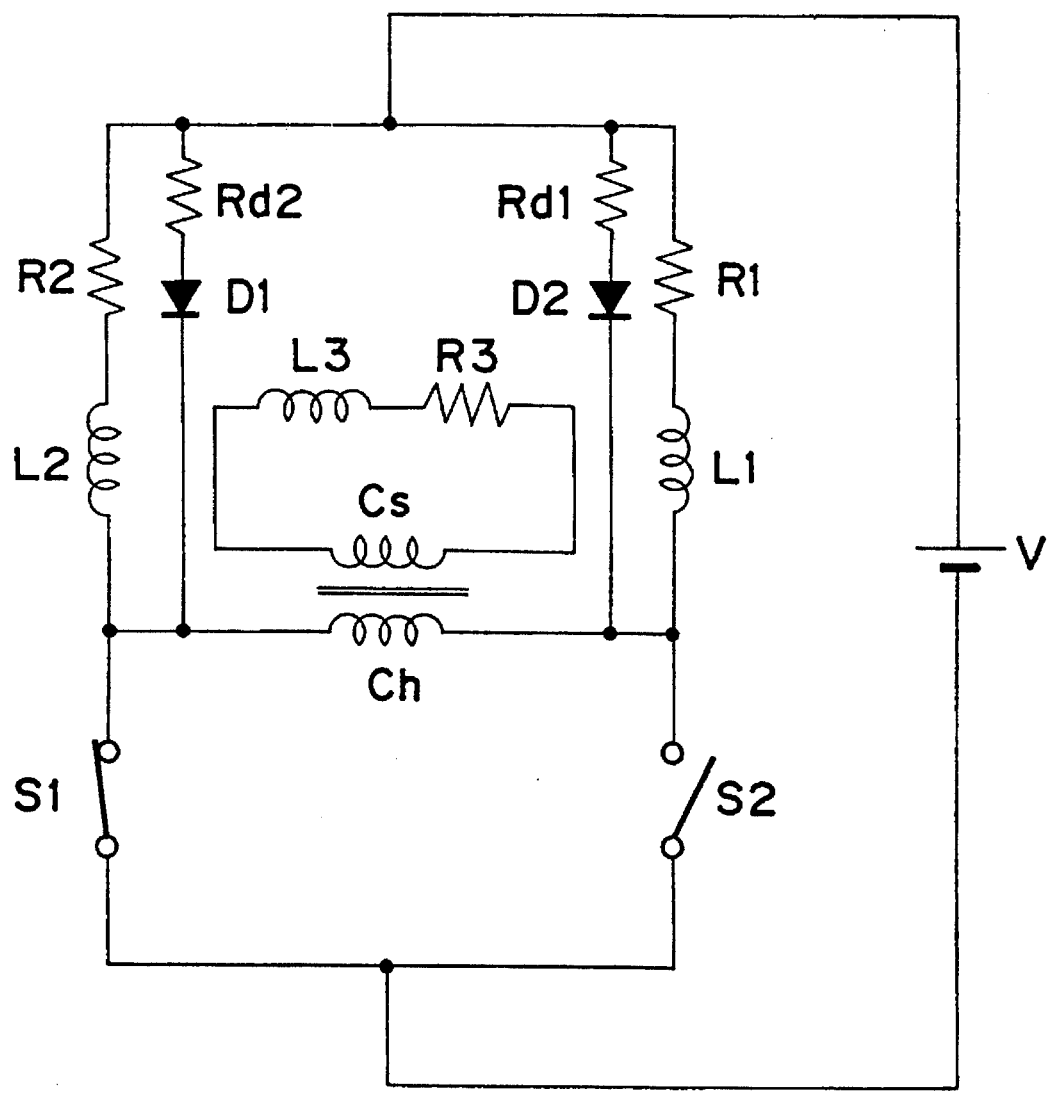

FIG. 17 is a circuit diagram showing still another embodiment of a magnetic head driving device according to the present invention. Note that the same reference numerals in FIG. 17 denote the same parts as in the conventional device shown in FIG. 2. The device shown in FIG. 17 includes an excitation coil $C_h$ constituting a magnetic head, a secondary coil $C_s$, and auxiliary coils L1 and L2 having inductances sufficiently larger than that of the excitation coil $C_h$. The device also includes current limiting resistors R1 and R2 for the excitation coil $C_h$, a damping resistor $R_d$, and switch elements S1 and S2 for switching the current direction of the excitation coil $C_h$. The switch elements S1 and S2 comprise field effect transistors. An acceleration coil L3 and its current limiting resistor R3 are connected to the secondary coil $C_s$. As has been described in detail above, the acceleration coil L3 has a function of shortening the current inversion time of the excitation coil $C_h$ to shorten the inversion time of the magnetic field. Note that the damping resistor $R_d$ need not always be connected in parallel with the excitation coil, as shown in FIG. 17. For example, two damping resistors $R_{d1}$ and $R_{d2}$ may be connected between the two terminals of the excitation coil $C_h$ and ground, as shown in FIG. 18, or may be connected between the two terminals of the excitation coil $C_h$ and a power supply, as shown in FIG. 19. Furthermore, as shown in FIG. 20, the two damping resistors $R_{d1}$ and $R_{d2}$ may be connected between the power supply and the two terminals of the excitation coil $C_h$ via diodes D1 and D2. The diodes D1 and D2 are used for shaping a current waveform by more effectively attenuating the current vibration of the excitation coil $C_h$.

The operation of this embodiment will be described below. In a normal magnetic head driving operation, when the switch elements S1 and S2 are alternately turned on, the current direction of the excitation coil $C_h$ is switched in correspondence with an information signal like in the conventional device. Thus, the magnetic head generates a magnetic field corresponding to the current direction of the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L3 connected through the secondary coil $C_s$, and the stray capacitance of the switch element. For example, when the drain-source path capacitance when the field effect transistor as the switch element is OFF is represented by $C_F$, the inductance of each of the excitation coil $C_h$ and the secondary coil $C_s$ is represented by $L_h$, the two coils have a coupling coefficient=1, and the inductance of the acceleration coil L3 is represented by $L_K$, a synthesized inductance L of the excitation coil $C_h$ and the acceleration coil L3 is given by:

$$L = L_h \cdot L_K / (L_h + L_K) \tag{11}$$

An inversion time t of a current supplied to the excitation coil $C_h$ at that time is given by:

$$t = \pi \sqrt{LC_F} \tag{12}$$

In this case, the resistance of the resistor R3 preferably satisfies $R3 \leq 2\pi f L_K$ when the frequency of the current vibration, in other words, a frequency f associated with the current inversion is given by:

$$f = 1/2\pi \sqrt{LC_F} \tag{13}$$

In contrast to this, since the conventional magnetic head driving device has neither the acceleration coil L3 nor the resistor R3, a current inversion time t' of the excitation coil $C_h$ is given by:

$$t' = \pi \sqrt{L_h C_F} \tag{14}$$

Since L and $L_h$ satisfy $L<L_h$, a relation t<t' is established, and as is understood from the above description, the current inversion time t of this embodiment is shorter than the conventional inversion time t'. As described above, since the acceleration coil L3 is connected to the secondary coil $C_s$ provided to the core of the magnetic head together with the excitation coil $C_h$, a current induced in the secondary coil $C_s$ upon a change in current of the excitation coil $C_h$ may act in a direction to decrease the magnetic field generated by the magnetic head. In order to prevent this, the resistance of the resistor R3 is preferably set to satisfy $R3 \geq 2\pi f_r L_h$ (where $f_r$ is the frequency of a signal to be recorded).

Thus, at the frequency $f_r$ of a signal to be recorded, the resistor R3 dominantly acts to block generation of an induction current in the secondary coil, and at the frequency f ($f>f_r$) associated with the current inversion, the inductance $L_K$ of the acceleration coil L3 dominantly acts. As a result, the current inversion time can be shortened without decreasing a current supplied to the excitation coil $C_h$.

Figure 21:
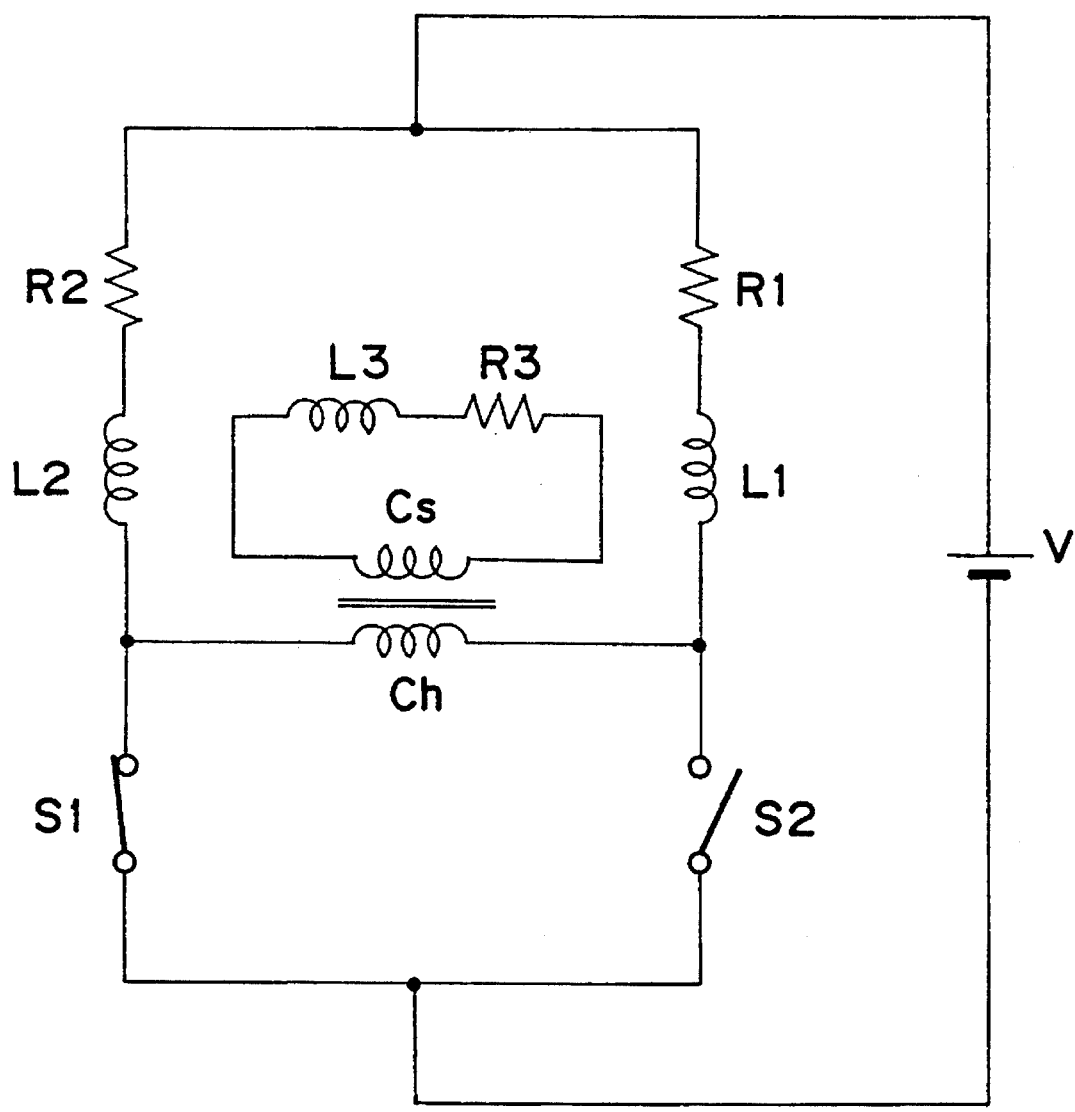

As described above, according to this embodiment, the inversion time of a current supplied to the excitation coil $C_h$ can be shortened as compared to the conventional device, and hence, the inversion time of a magnetic field generated by the magnetic head can be shortened. Therefore, this embodiment can satisfy the requirement for increasing the inversion speed of a bias magnetic field in the pit edge recording method, and can remarkably contribute to a high recording density as a merit of the pit edge recording method. The present inventors experimentally confirmed that the resistor R3 connected in series with the acceleration coil L3 also serves as a damping resistor, and has an effect of attenuating the current vibration of the excitation coil $C_h$ as well. Therefore, as shown in FIG. 21, the damping resistor $R_d$ may be omitted, so that the resistor R3 also serves as a damping resistor.

Figure 22:
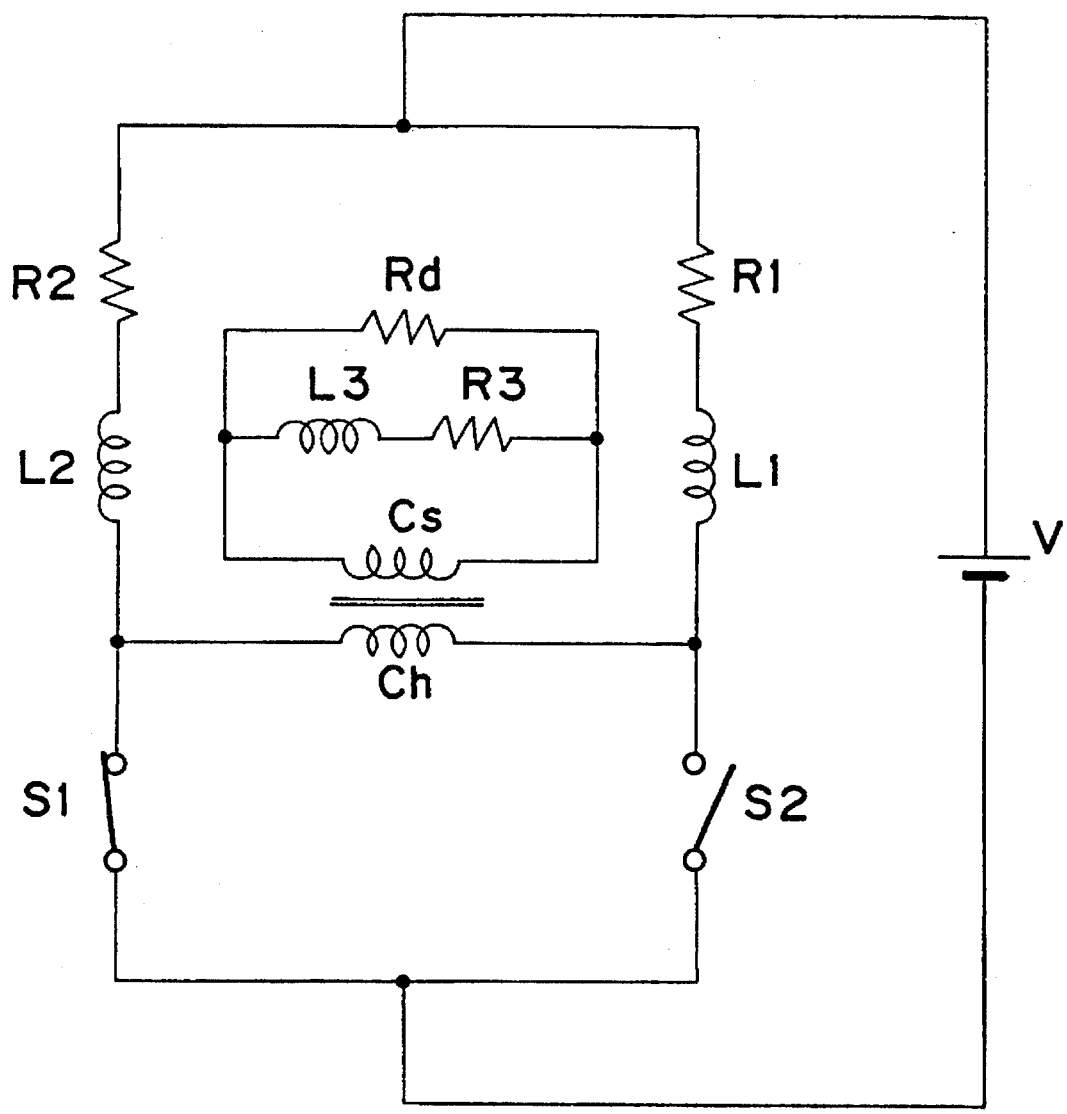

Also, as shown in FIG. 22, the damping resistor $R_d$ may be connected in parallel with the acceleration coil L3 and the resistor R3.

Figure 23:
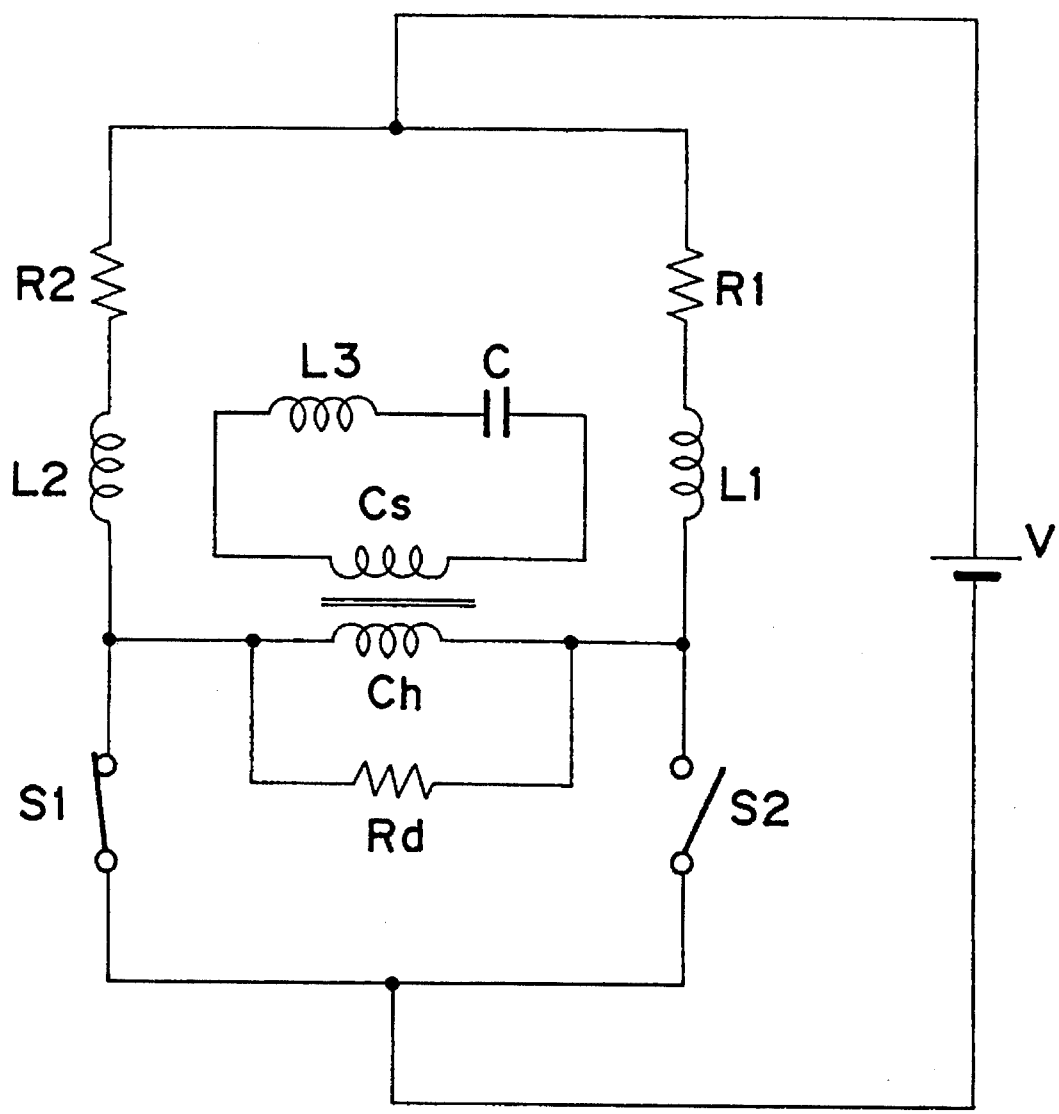
Figure 24:
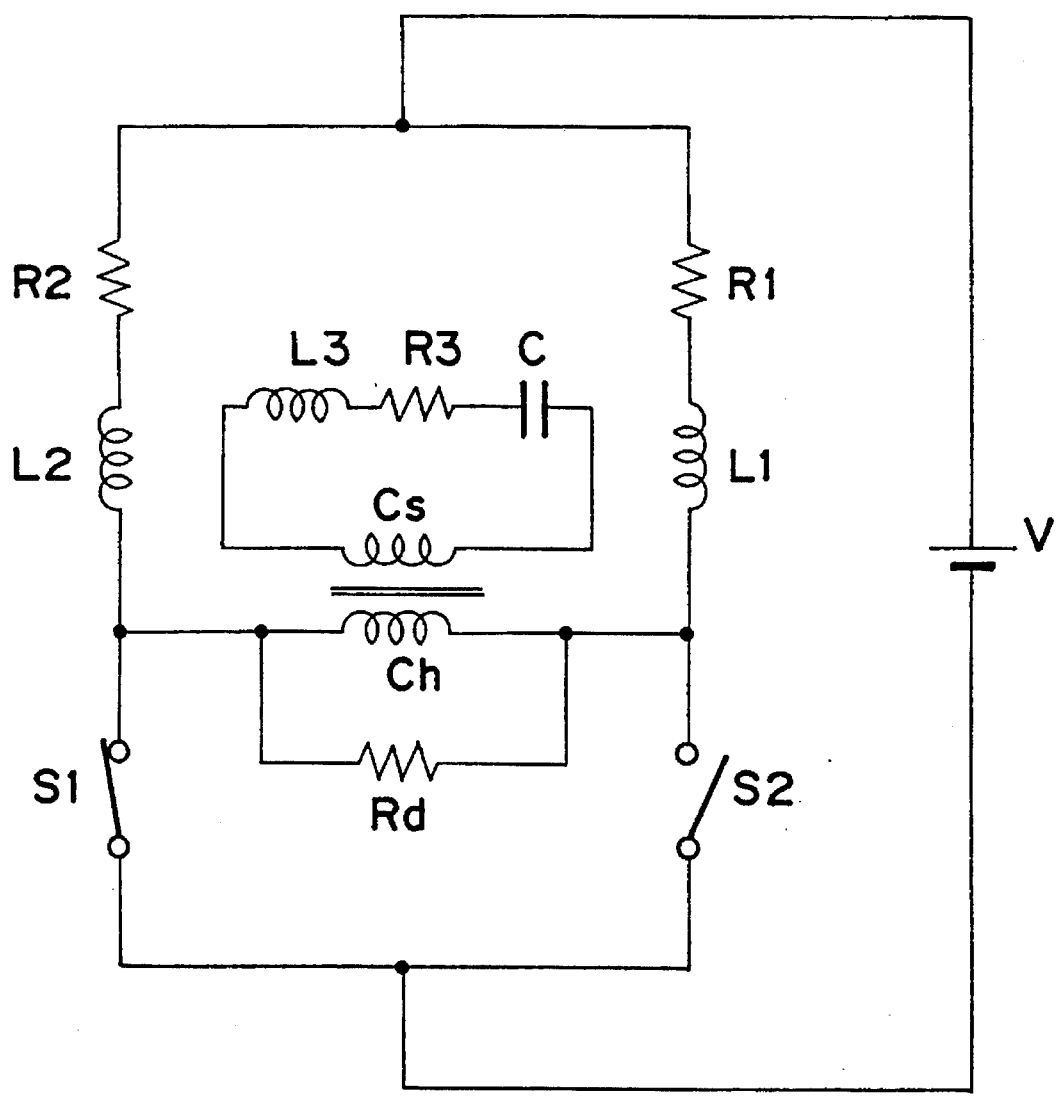
Figure 25:
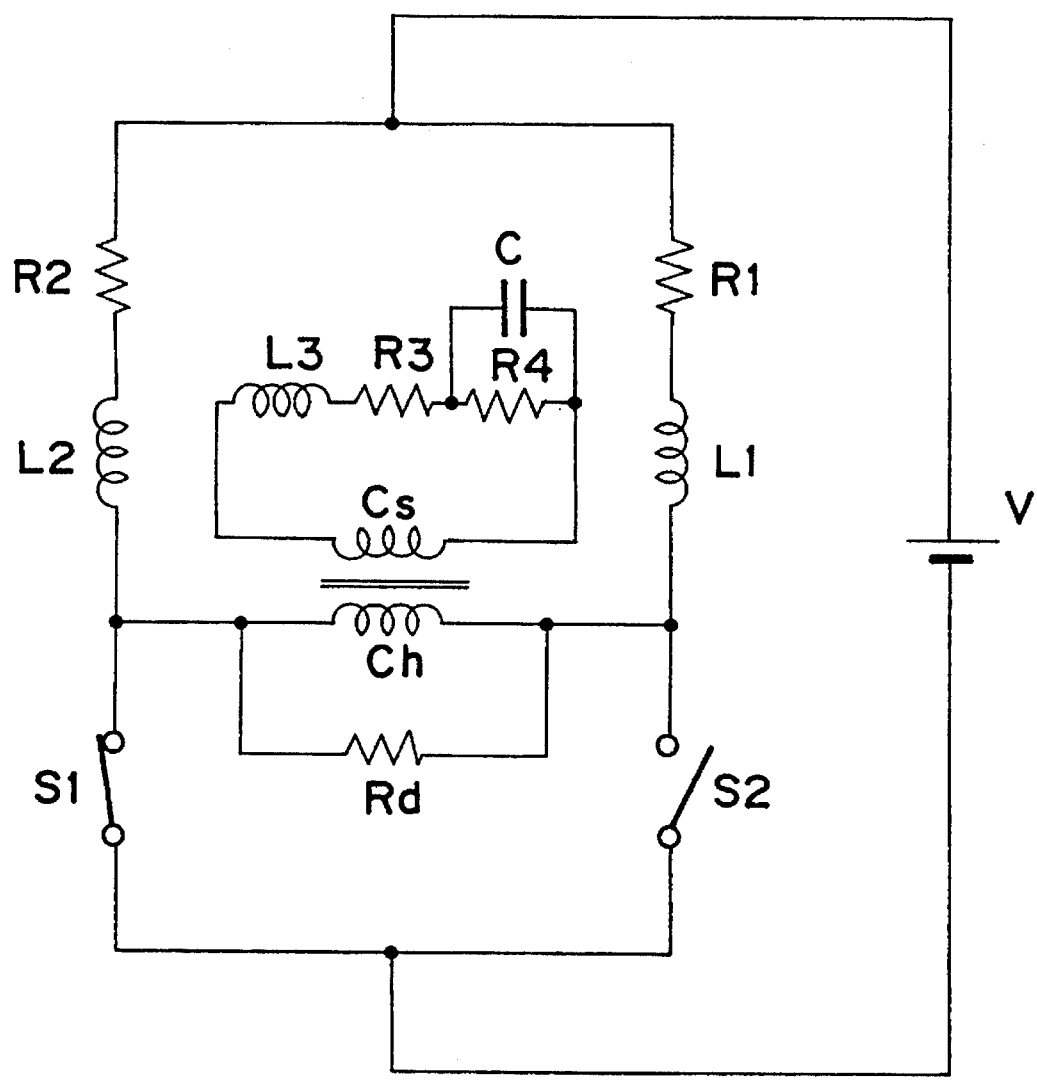

Other embodiments of a magnetic head driving device according to the present invention will be described below. FIGS. 23, 24, and 25 show embodiments of the present invention, which are characterized in that an element or circuit having high-frequency band pass characteristics, i.e., a high-pass filter is connected in series with an acceleration coil L3. The basic operations of these embodiments are the same as those in the above embodiments.

A capacitor C in FIG. 23, a resistor R3 and a capacitor C in FIG. 24, and resistors R3 and R4 and a capacitor C shown in FIG. 25 constitute high-pass filters connected in series with the acceleration coil L3. These high-pass filters are arranged to replace the current limiting resistor R3 in the above embodiment shown in FIGS. 17 to 22. Each of these high-pass filters blocks a current flowing into the acceleration coil L3 at the frequency $f_r$ of a signal to be recorded, and the inductance of the acceleration coil L3 effectively acts at the frequency f ($f > f_r$) associated with current inversion. Thus, these high-pass filters have as their object to consequently shorten the inversion time of a current to be supplied to the excitation coil without decreasing the magnetic field generated by the magnetic head on the basis of the above-mentioned principle. The high-pass filters of these embodiments can more effectively achieve the above object by utilizing their high-frequency band pass characteristics than the resistor R3 in the above-mentioned embodiment.

The high-pass filter can be designed to have effective frequency characteristics according to the frequency $f_r$ of a recording signal and the frequency f associated with the current inversion. The circuit arrangement of the high-pass filter is not limited to those of the above embodiments, but may be realized by various other circuit arrangements.

In the embodiments described above, the present invention is applied to the magnetic head driving device having auxiliary coils with sufficiently large inductances. However, the present invention can also be applied to other conventional magnetic head driving devices. Such an embodiment will be described below.

Figure 26:
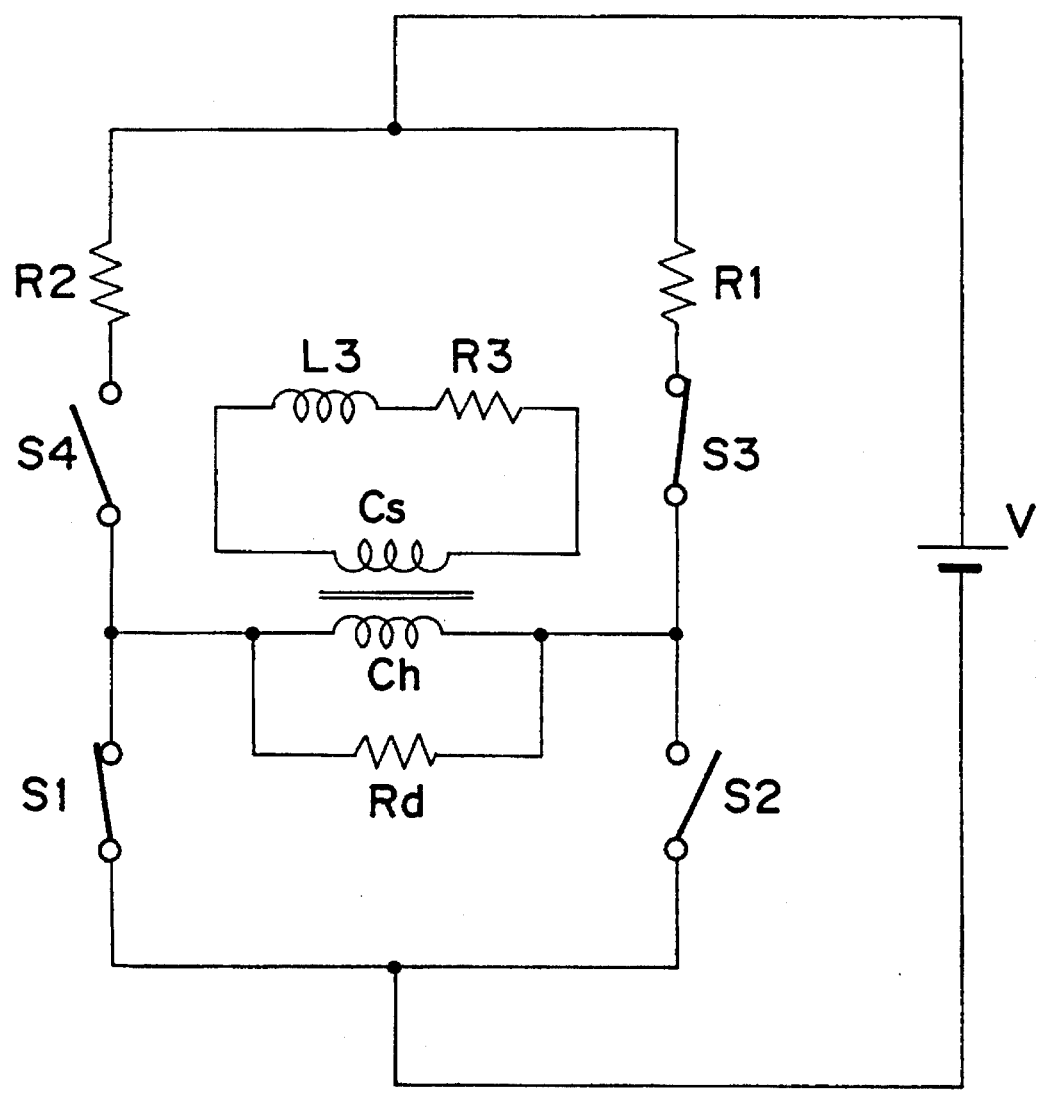

FIG. 26 shows a magnetic head driving circuit for supplying a current to an excitation coil $C_h$ by a bridge circuit using four switch elements S1, S2, S3, and S4. In this embodiment, the switch elements S1 and S3, and the switch elements S2 and S4 are alternately turned on/off according to an information signal to be recorded, thereby alternately inverting a current supplied to the excitation coil $C_h$. In this embodiment as well, since an acceleration coil L3 is connected in parallel with a secondary coil $C_s$ provided to a core of the magnetic head together with the excitation coil $C_h$, the current inversion time can be shortened as in the above embodiments. In the embodiment shown in FIG. 26, a resistor R3 is connected in series with the acceleration coil L3, and a damping resistor $R_d$ is connected in parallel with the excitation coil $C_h$. In addition, the circuit arrangements shown in FIGS. 18 to 25 in the above embodiment may be adopted.

In the above-mentioned embodiments of the present invention, since the acceleration coil is connected in parallel with the excitation coil via the secondary coil, the current inversion time of the excitation coil can be shortened, and the magnetic field inversion time of the magnetic head can be shortened. Therefore, the above-mentioned devices can be suitably applied to a magnetic head driving device for the pit edge recording method, which requires high-speed inversion of a bias magnetic field. When the above-mentioned device is used in the magnetooptical recording apparatus of the magnetic field modulation type, it can remarkably contribute to an increase in information recording density.

Figure 27:
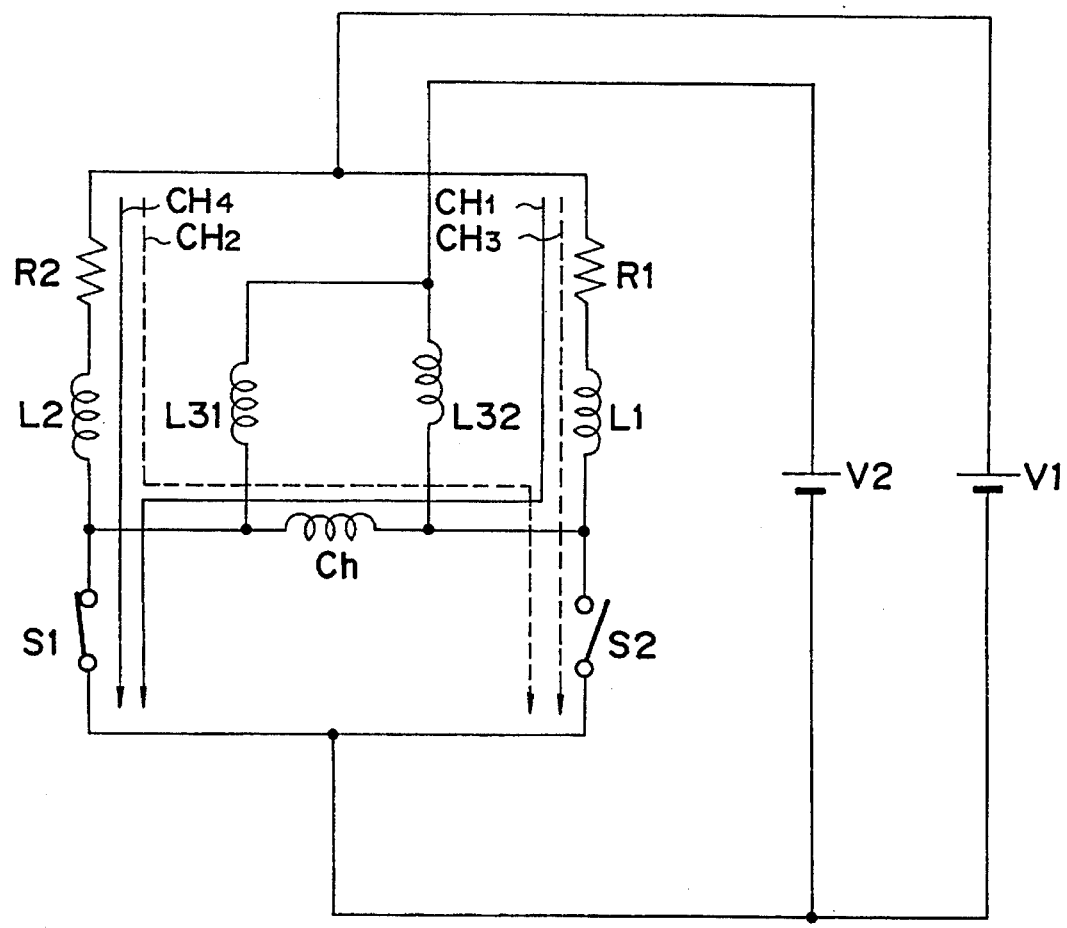

Still another embodiment of the present invention will be described in detail below with reference to the accompanying drawings. FIG. 27 is a circuit diagram showing still another embodiment of a magnetic head driving device according to the present invention. Note that the same reference numerals in FIG. 27 denote the same parts as in the conventional device shown in FIG. 2. The device shown in FIG. 27 includes an excitation coil $C_h$ constituting a magnetic head, and auxiliary coils L1 and L2 having inductances sufficiently larger than that of the excitation coil $C_h$. The device also includes current limiting resistors R1 and R2 for the excitation coil $C_h$, and switch elements S1 and S2 for switching the current direction of the excitation coil $C_h$. The switch elements S1 and S2 comprise, e.g., field effect transistors. Acceleration coils L31 and L32 are connected between the two terminals of the excitation coil $C_h$ and a DC voltage source V2.

The magnetic head driving device of the present invention shown in FIG. 27 is used in the magnetooptical recording apparatus of the magnetic field modulation type described above with reference to FIG. 1.

Figure 28:
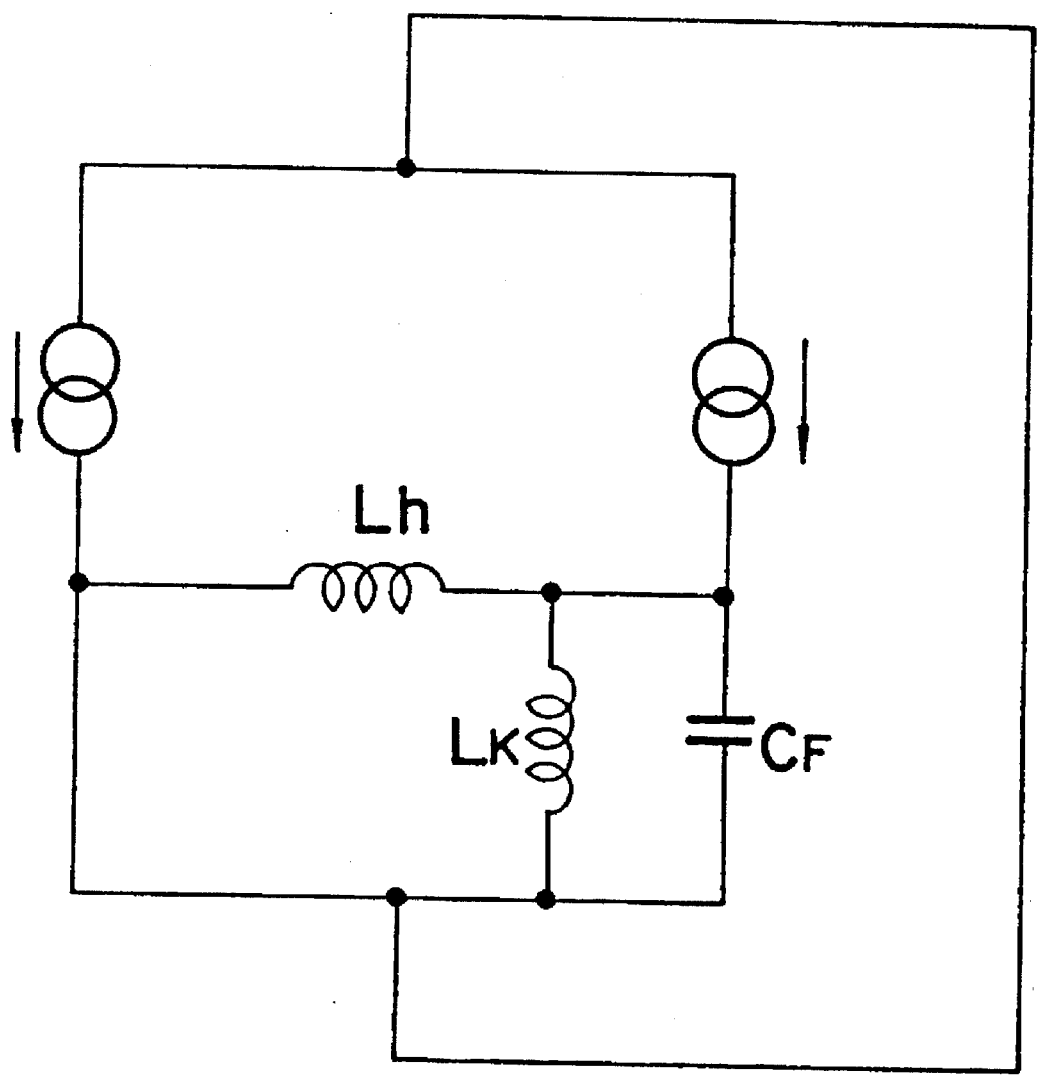
FIG. 28 is a circuit diagram showing an equivalent circuit of a magnetic head driving device according to the present invention.

The operation of this embodiment will be described below. Basically, when the switch elements S1 and S2 are alternately turned on, the current direction of the excitation coil $C_h$ is switched in correspondence with an information signal as in the conventional device. Thus, the magnetic head generates a magnetic field corresponding to the current direction of the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L31 (or L32), and the stray capacitance of the switch element. This will be described below. When the drain-source path capacitance when the field effect transistor as the switch element is OFF is represented by $C_F$, the inductance of the excitation coil $C_h$ is represented by $L_h$, and the inductance of the acceleration coil L31 or L32 is represented by $L_K$, a state wherein the switch element S1 is ON and the switch element S2 is OFF is expressed by an equivalent circuit shown in FIG. 28 if the auxiliary coils L1 and L2 having the sufficiently large inductances are considered as constant current sources. As can be seen from FIG. 28, a transient phenomenon immediately after switching can be considered as a vibration phenomenon between the capacitance $C_F$ and the synthesized inductance of the inductances $L_h$ and $L_K$. A synthesized inductance L of the excitation coil $C_h$ and the acceleration coil L31 or L32 is given by:

$$L = L_h \cdot L_K / (L_h + L_K) \qquad (15)$$

An inversion time t of a current supplied to the excitation coil $C_h$ at that time is given by:

$$t = \pi \sqrt{L C_F} \qquad (16)$$

In contrast to this, since the conventional magnetic head driving device shown in FIG. 2 does not have an acceleration coil, a current inversion time t' of the excitation coil $C_h$ is given by:

$$t' = \pi \sqrt{L_h C_F} \qquad (17)$$

Since L and $L_h$ satisfy $L < L_h$, a relation $t < t'$ is established, and as is understood from the above description, the current inversion time t of this embodiment is shorter than the conventional inversion time t'.

As described above, according to the magnetic head driving device of the present invention, the inversion time of a current supplied to the excitation coil $C_h$ can be shortened as compared to the conventional device, and hence, the inversion speed of a magnetic field generated by the magnetic head can be increased. Therefore, the device can satisfy the requirement for increasing the bias magnetic field inversion speed in the pit edge recording method, and can greatly contribute to a high recording density as a merit of the pit edge recording.

In the above-mentioned embodiment, since the acceleration coils L31 and L32 are connected between the two terminals of the excitation coil $C_h$ and the DC voltage source V2, some current components to be originally supplied to the excitation coil $C_h$ may flow into the acceleration coils L31 and L32, or conversely, currents may flow from the acceleration coils L31 and L32 into the excitation coil $C_h$. As a result, a current supplied to the excitation coil $C_h$ may become short or excessive, and signal recording may be disturbed. In order to avoid such a situation, a means for effectively blocking flow-in/out currents with respect to the acceleration coils L31 and L32 can be arranged. Still another embodiment having such a means will be explained below.

Magnetic head driving devices according to the present invention shown in FIGS. 29 to 40 are used in the magnetooptical recording apparatus of the magnetic field modulation type described above with reference to FIG. 1.

Figure 29:
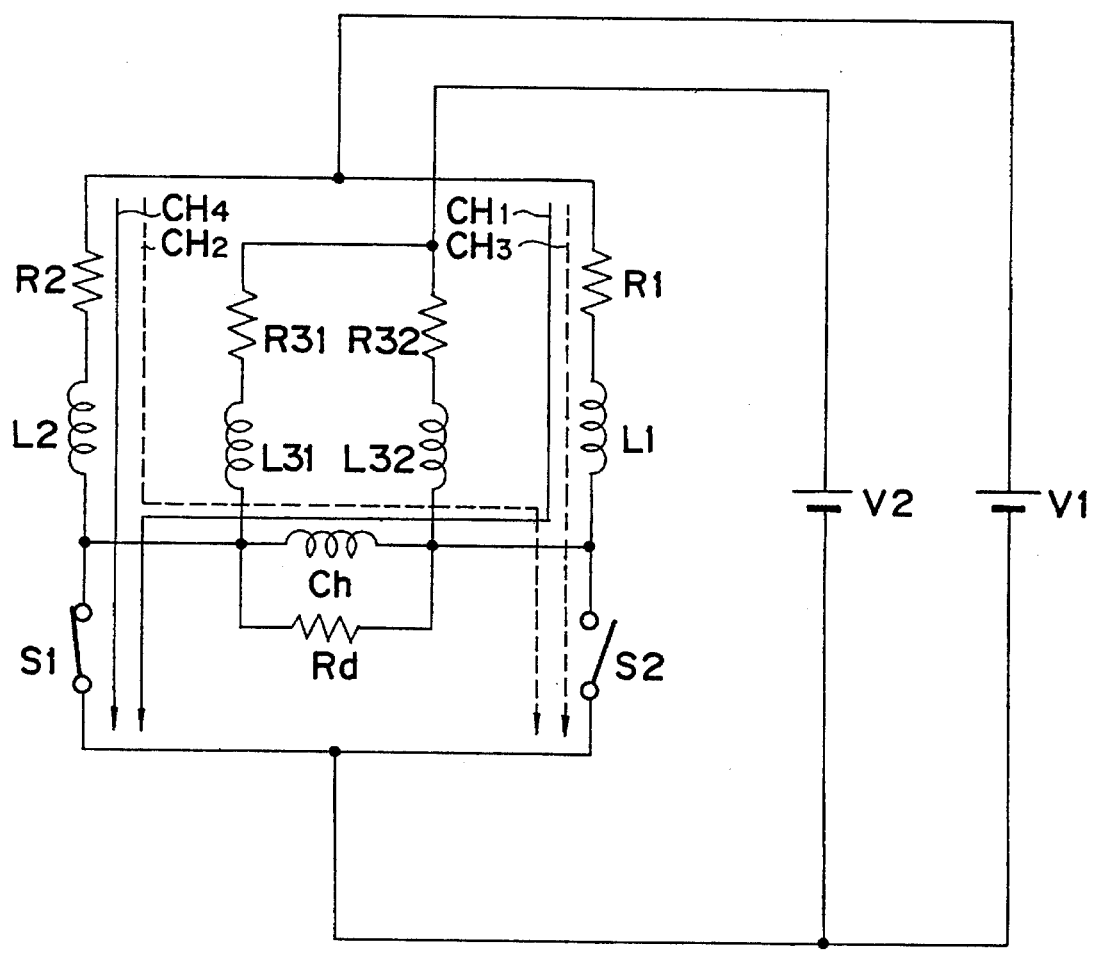
FIGS. 29 to 40 are circuit diagrams showing other embodiments of magnetic head driving devices according to the present invention.

FIG. 29 is a circuit diagram showing still another embodiment of a magnetic head driving device according to the present invention. Note that the same reference numerals in FIG. 29 denote the same parts as in the conventional device shown in FIG. 2. The device shown in FIG. 29 includes an excitation coil $C_h$ constituting a magnetic head, and auxiliary coils L1 and L2 having inductances sufficiently larger than that of the excitation coil $C_h$. The device also includes current limiting resistors R1 and R2 for the excitation coil $C_h$, a damping resistor $R_d$, and switch elements S1 and S2 for switching the current direction of the excitation coil $C_h$. The switch elements S1 and S2 comprise field effect transistors. An acceleration coil L31 and its current limiting resistor R31 are connected between one terminal of the excitation coil $C_h$ and a DC voltage source V2. Also, an acceleration coil L32 and its current limiting resistor R32 are connected between the other terminal of the excitation coil $C_h$ and the DC voltage source V2.

Figure 30:
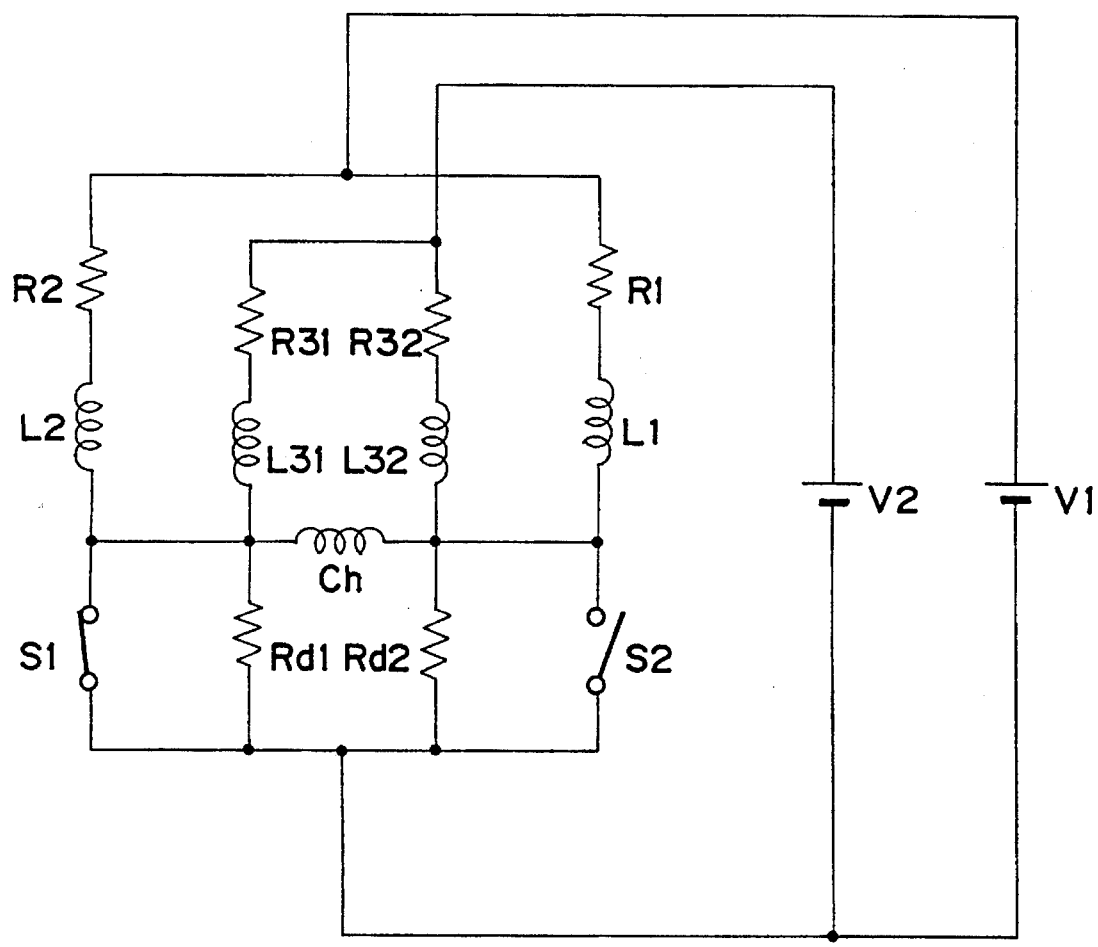
Figure 31:
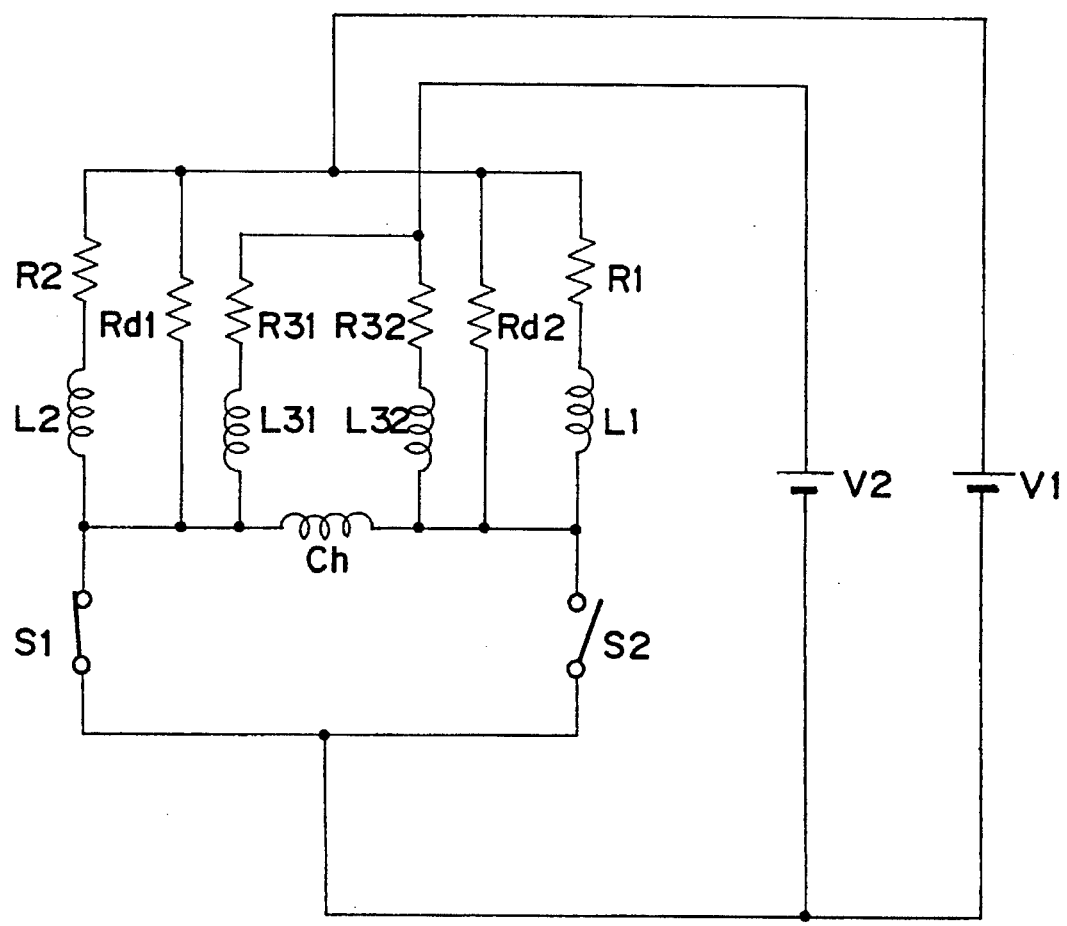
Figure 32:
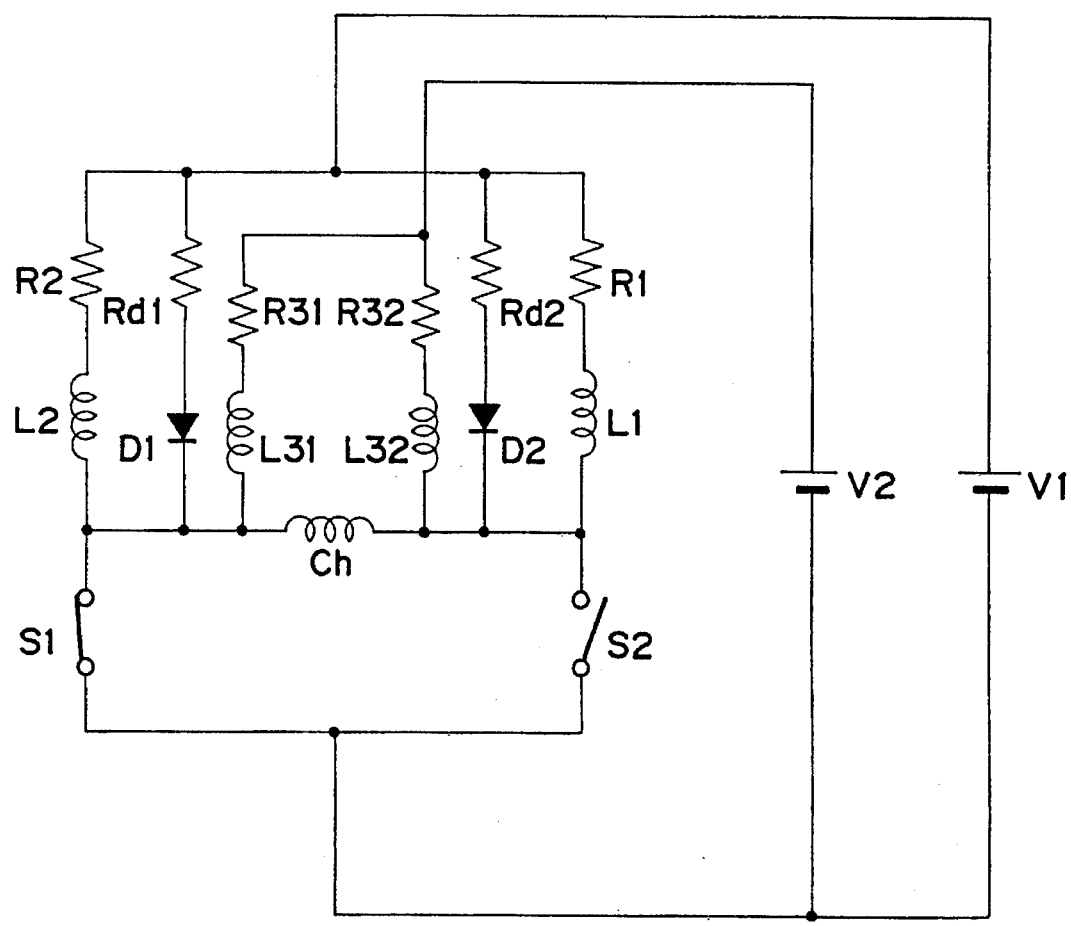

As has been described in detail above, the acceleration coils L31 and L32 have a function of shortening the current inversion time of the excitation coil $C_h$ to shorten the inversion time of the magnetic field. Note that the damping resistor $R_d$ need not always be connected in parallel with the excitation coil, as shown in FIG. 29. For example, two damping resistors $R_{d1}$ and $R_{d2}$ may be connected between the two terminals of the excitation coil $C_h$ and ground, as shown in FIG. 30, or may be connected between the two terminals of the excitation coil $C_h$ and a power supply V1, as shown in FIG. 31. Furthermore, as shown in FIG. 32, the two damping resistors $R_{d1}$ and $R_{d2}$ may be connected between the power supply and the two terminals of the excitation coil $C_h$ via diodes D1 and D2. The diodes D1 and D2 are used for shaping a current waveform by more effectively attenuating the current vibration of the excitation coil $C_h$.

The operation of this embodiment will be described below. In a normal magnetic head driving operation, when the switch elements S1 and S2 are alternately turned on, the current direction of the excitation coil $C_h$ is switched in correspondence with an information signal as in the conventional device. Thus, the magnetic head generates a magnetic field corresponding to the current direction of the excitation coil $C_h$, and generates a bias magnetic field whose polarity is modulated according to the information signal. When the current of the excitation coil $C_h$ is inverted, in this embodiment, the inversion time is determined by a vibration period defined by a synthesized value of the inductance of the excitation coil $C_h$ and the inductance of the acceleration coil L31 or L32, and the stray capacitance of the switch element. For example, when the drain-source path capacitance when the field effect transistor as the switch element is OFF is represented by $C_F$, the inductance of the excitation coil $C_h$ is represented by $L_h$, and the inductance of the acceleration coil L31 or L32 is represented by $L_K$, a synthesized inductance L of the excitation coil $C_h$ and the acceleration coil L31 or L32 is given by:

$$L = L_h \cdot L_K / (L_h + L_K) \qquad (18)$$

An inversion time t of a current supplied to the excitation coil $C_h$ at that time is given by:

$$t = \pi \sqrt{L C_F} \qquad (19)$$

In this case, the resistance of the resistor R31 or R32 preferably satisfies R31 (or R32) $\leq 2\pi f L_K$ when the frequency of the current vibration, in other words, a frequency f associated with the current inversion is given by:

$$f = 1/2\pi \sqrt{L C_F} \qquad (20)$$

In contrast to this, since the conventional magnetic head driving device has neither the acceleration coils L31 and L32 nor the resistors R31 and R32, a current inversion time t' of the excitation coil $C_h$ is given by:

$$t' = \pi \sqrt{L_h C_F} \qquad (21)$$

Since L and $L_h$ satisfy $L < L_h$, a relation $t < t'$ is established, and as is understood from the above description, the current inversion time t of this embodiment is shorter than the conventional inversion time t'. Since the acceleration coils L31 and L32 are provided, the current supplied to the excitation coil $C_h$ may become short or excessive, as described above. In order to prevent this, the resistance of the resistor R31 or R32 is preferably set to satisfy R31 (or R32)$\geq 2\pi f_r L_h$ (where $f_r$ is the frequency of a signal to be recorded).

Thus, at the frequency $f_r$ of a signal to be recorded, the resistors R31 and R32 dominantly act to block flow-in/out currents with respect to the acceleration coils L31 and L32, and at the frequency f (f>$f_r$) associated with current inversion, the inductances $L_K$ of the acceleration coils L31 and L32 dominantly act. As a result, the current inversion time can be shortened without causing short or excessive supply of a current to the excitation coil $C_h$.

Figure 33:
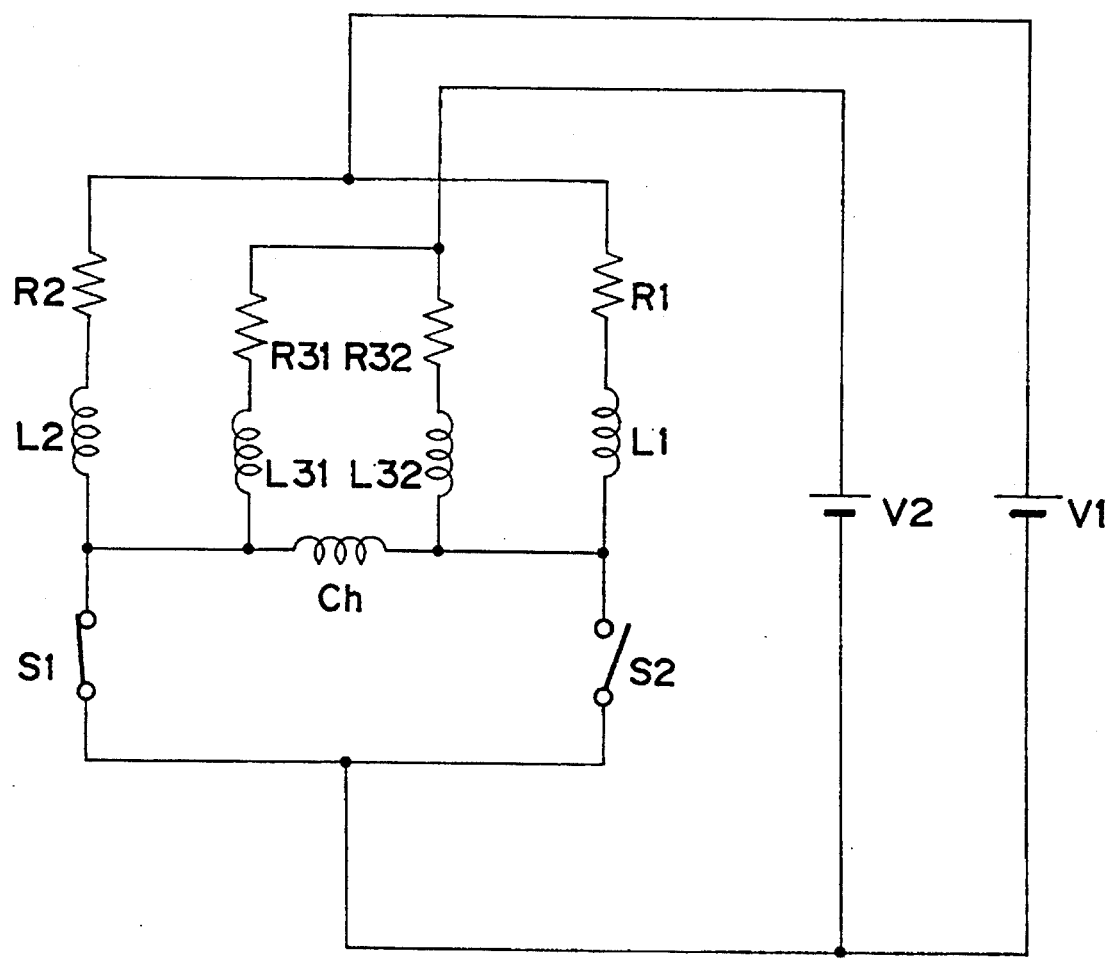

As described above, according to this embodiment, the inversion time of a current supplied to the excitation coil $C_h$ can be shortened as compared to the conventional device, and hence, the inversion time of a magnetic field generated by the magnetic head can be shortened. Therefore, this embodiment can satisfy the requirement for increasing the inversion speed of a bias magnetic field in the pit edge recording method, and can remarkably contribute to a high recording density as a merit of the pit edge recording method. The present inventors experimentally confirmed that the resistors R31 and R32 connected in series with the acceleration coils L31 and L32 also serve as damping resistors, and have an effect of attenuating the current vibration of the excitation coil $C_h$ as well. Therefore, as shown in FIG. 33, the damping resistor $R_d$ may be omitted, so that the resistors R31 and R32 also serve as damping resistors.

Figure 34:
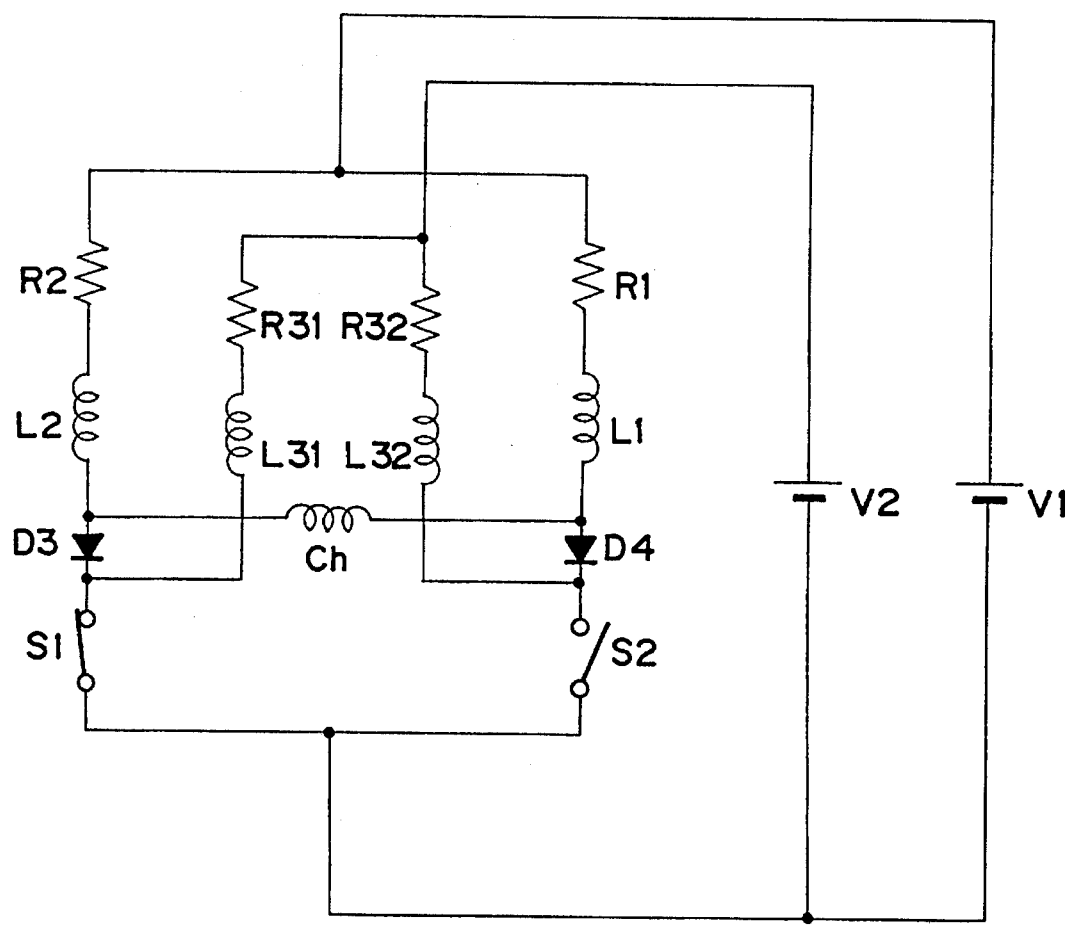

For example, as shown in FIG. 34, diodes D3 and D4 may be connected between the excitation coil $C_h$ and the switch elements S1 and S2 for the purpose of preventing the reverse flow of a current from the switch elements S1 and S2 toward the excitation coil $C_h$ and improving settling characteristics upon current inversion. In this case, the acceleration coils L31 and L32 may be arranged, together with the resistors R31 and R32, on circuit paths from positions between the diode D3 and the switch element S1 and between the diode D4 and the switch element S2 to the DC voltage source V2. Of course, the acceleration coils L31 and L32 may be directly connected to the two terminals of the excitation coil $C_h$ as in the above-mentioned embodiment, and the same effect can be expected in this case.

In this manner, according to the present invention, the acceleration coils need not always be directly connected to the two terminals of the excitation coils, but need only be arranged substantially at positions between the two terminals of the excitation coil and the DC voltage source or ground, thus obtaining a sufficient effect.

Figure 35:
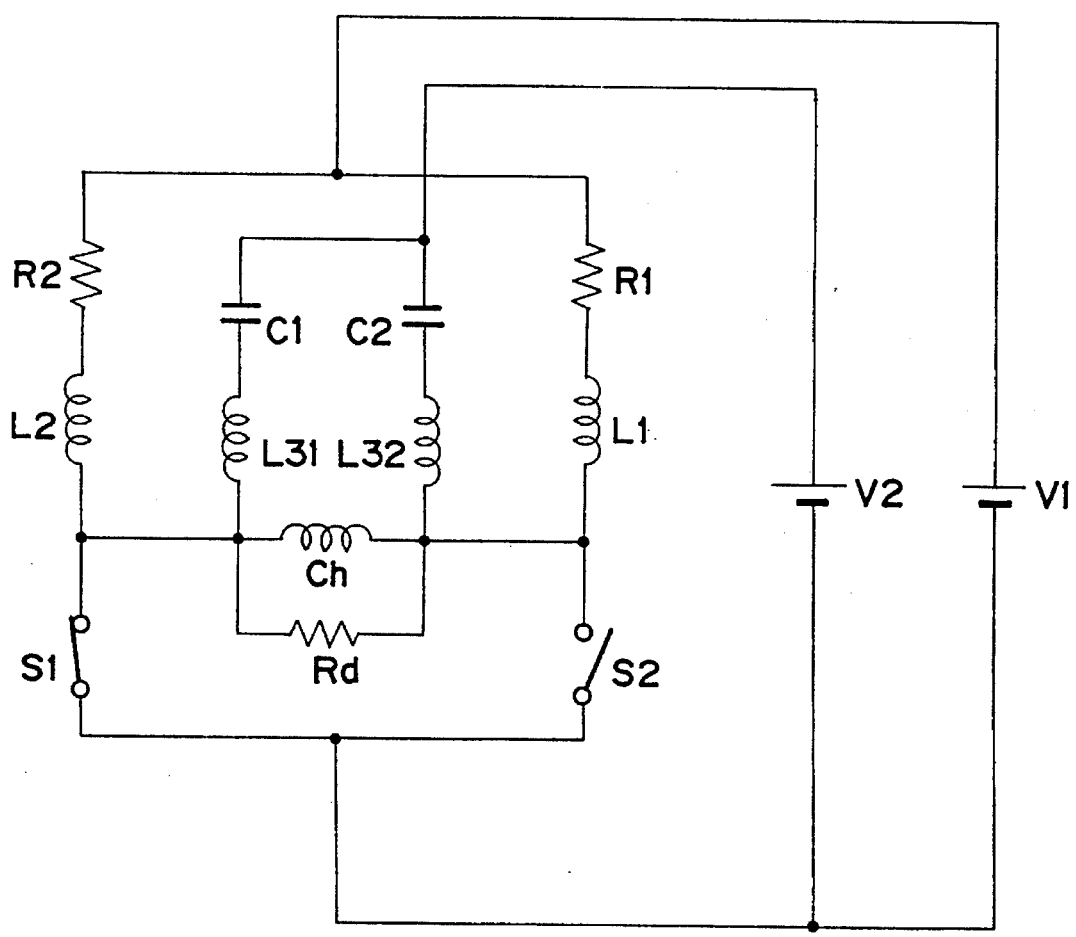
Figure 36:
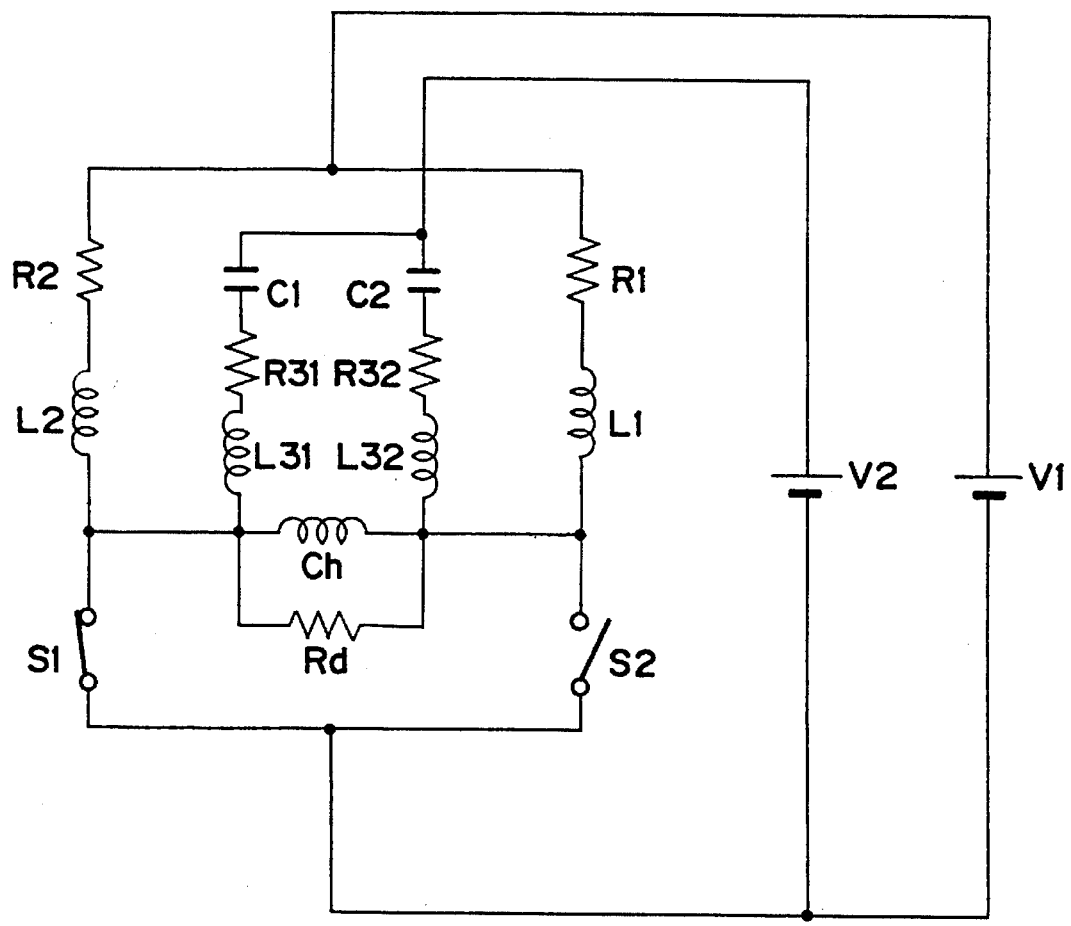
Figure 37:
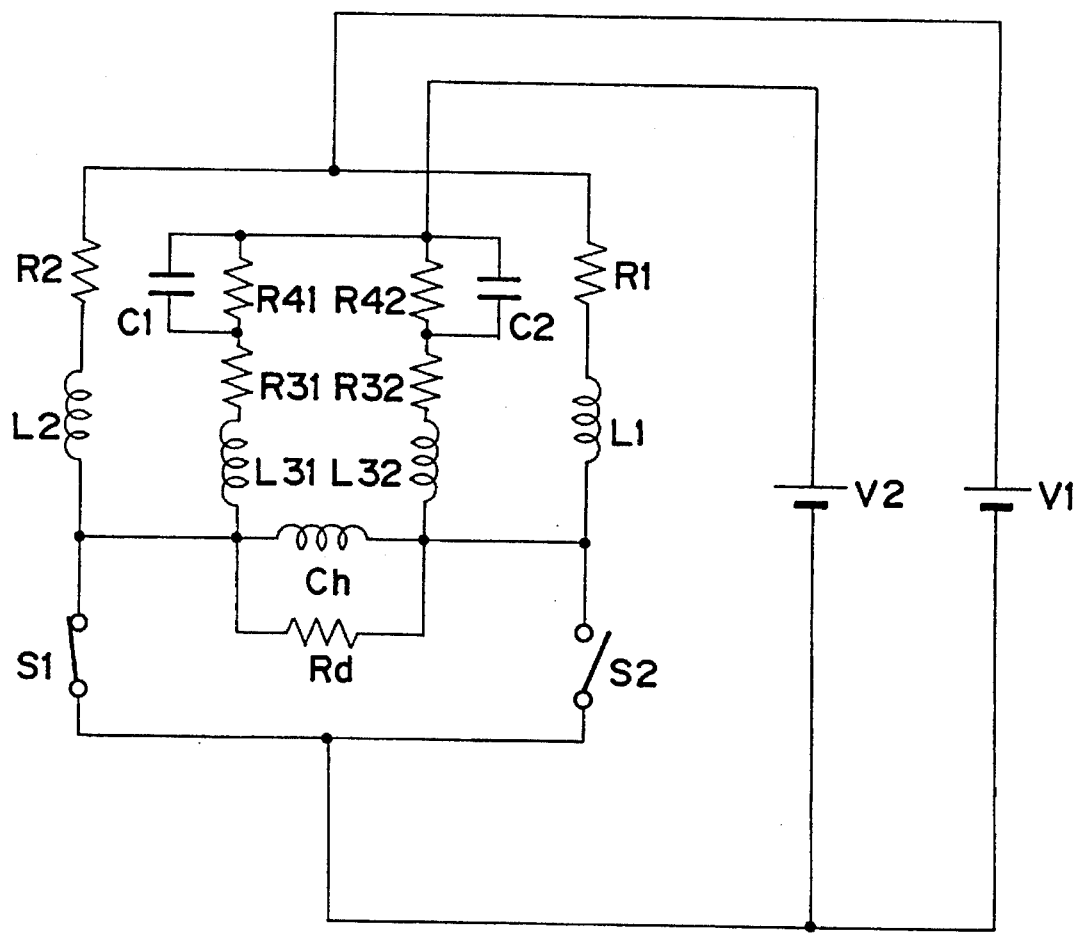

Other embodiments of a magnetic head driving device according to the present invention will be described below. FIGS. 35, 36, and 37 show embodiments of the present invention, which are characterized in that elements or circuits having high-frequency band pass characteristics, i.e., high-pass filters are connected in series with acceleration coils L31 and L32. The basic operations of these embodiments are the same as those in the above embodiments.

Capacitors C1 and C2 in FIG. 35, resistors R31 and R32 and capacitors C1 and C2 in FIG. 36, and resistors R31, R32, R41, and R42 and capacitors C1 and C2 in FIG. 37 constitute high-pass filters connected in series with the acceleration coils L31 and L32. These high-pass filters are arranged to replace the current limiting resistors R31 and R32 in the above embodiment shown in FIGS. 29 to 34.

These high-pass filters block flow-in/out currents with respect to the acceleration coils L31 and L32 at the frequency $f_r$ of a signal to be recorded, and the inductances of the acceleration coils L31 and L32 effectively act at the frequency f (f>$f_r$) associated with current inversion. Thus, these high-pass filters have as their object to consequently shorten the current inversion time without causing short or excessive supply of currents to the excitation coil $C_h$ on the basis of the above-mentioned principle. In these embodiments, the above-mentioned object can be more effectively achieved by utilizing the high-frequency band pass characteristics of the high-pass filters than the current limiting resistors R31 and R32 in the above embodiment.

The high-pass filters can be designed to have effective frequency characteristics according to the frequency $f_r$ of a recording signal and the frequency f associated with the current inversion. The circuit arrangements of the high-pass filters are not limited to those of the above embodiments, but may be realized by various other circuit arrangements.

In the embodiments described above, the present invention is applied to the magnetic head driving device having auxiliary coils with sufficiently large inductances. However, the present invention can also be applied to other conventional magnetic head driving devices. Such an embodiment will be described below.

Figure 38:
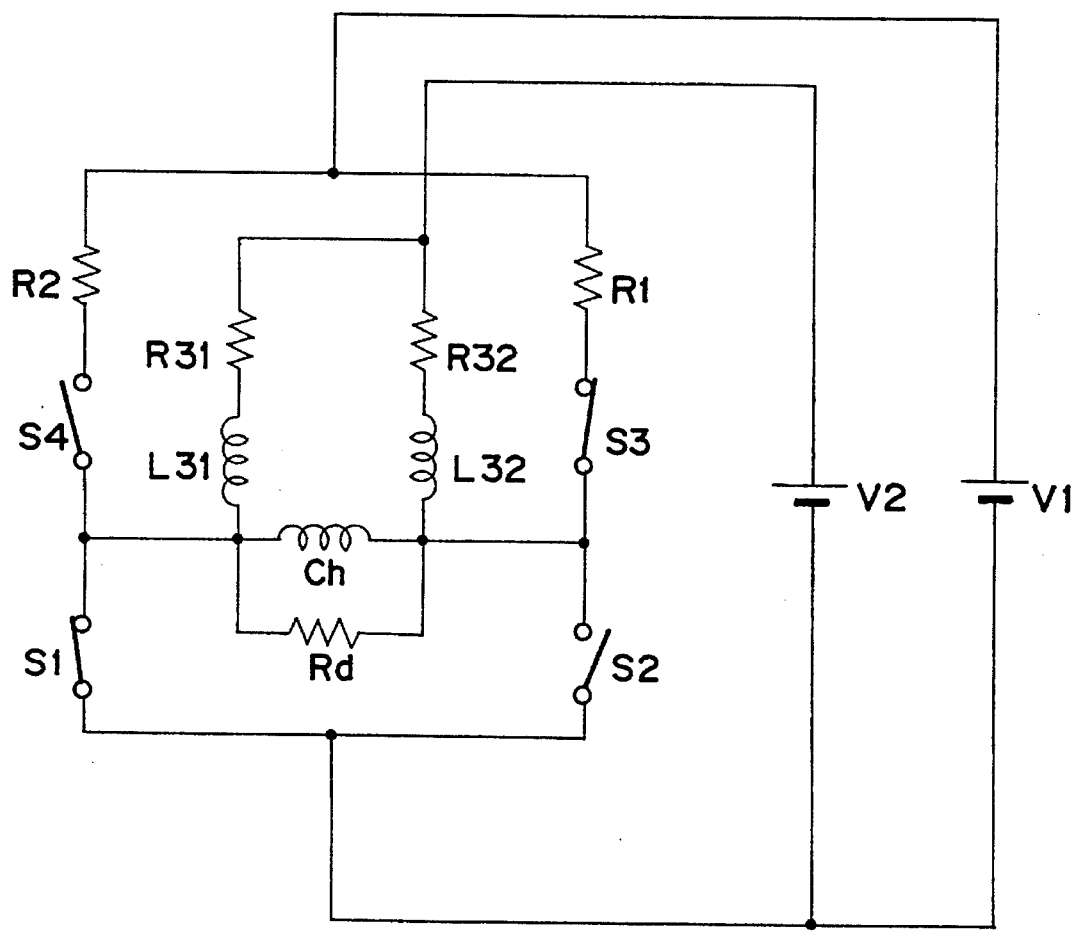

FIG. 38 shows a magnetic head driving circuit for supplying a current to an excitation coil $C_h$ by a bridge circuit using four switch elements S1, S2, S3, and S4. In this embodiment, the switch elements S1 and S3, and the switch elements S2 and S4 are alternately turned on/off according to recording information, thereby alternately inverting the direction of a current supplied to the excitation coil $C_h$. In this embodiment as well, when acceleration coils L31 and L32 are connected between the two terminals of the excitation coil $C_h$ and a DC voltage source V2, the current inversion time can be shortened as in the above embodiments. In the embodiment shown in FIG. 38, current limiting resistors R31 and R32 are connected in series with the acceleration coils L31 and L32, and a damping resistor $R_d$ is connected in parallel with the excitation coil $C_h$. In addition, the circuit arrangements shown in FIGS. 30 to 37 in the above embodiment may be adopted.

Figure 39:
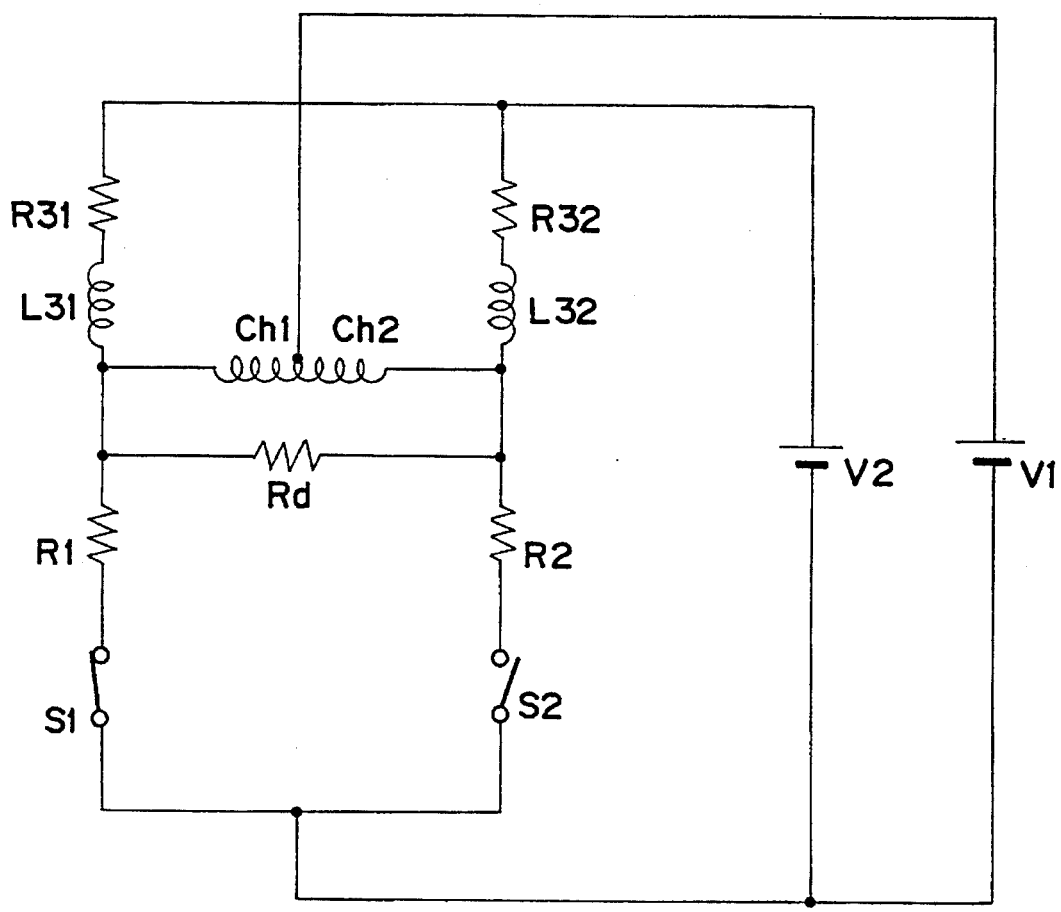

FIG. 39 shows an embodiment wherein two excitation coils $C_{h1}$ and $C_{h2}$ are provided to a magnetic head, and currents in different directions are alternately supplied to the excitation coils $C_{h1}$ and $C_{h2}$ according to recording information, thereby inverting a bias magnetic field. In this embodiment as well, when acceleration coils L31 and L32 are connected between the two terminals of the excitation coils $C_{h1}$ and $C_{h2}$ and a DC voltage source V2 as in the above embodiment, the rising and falling times of currents supplied to the excitation coils $C_{h1}$ and $C_{h2}$ can be shortened. As a result, high-speed inversion of a bias magnetic field can be realized. In the embodiment shown in FIG. 39, current limiting resistors R31 and R32 are connected in series with the acceleration coils L31 and L32, respectively, and a damping resistor $R_d$ is connected in parallel with the excitation coils $C_{h1}$ and $C_{h2}$. In addition, the circuit arrangements shown in FIGS. 30 to 37 in the above embodiment may be adopted.

Figure 40:
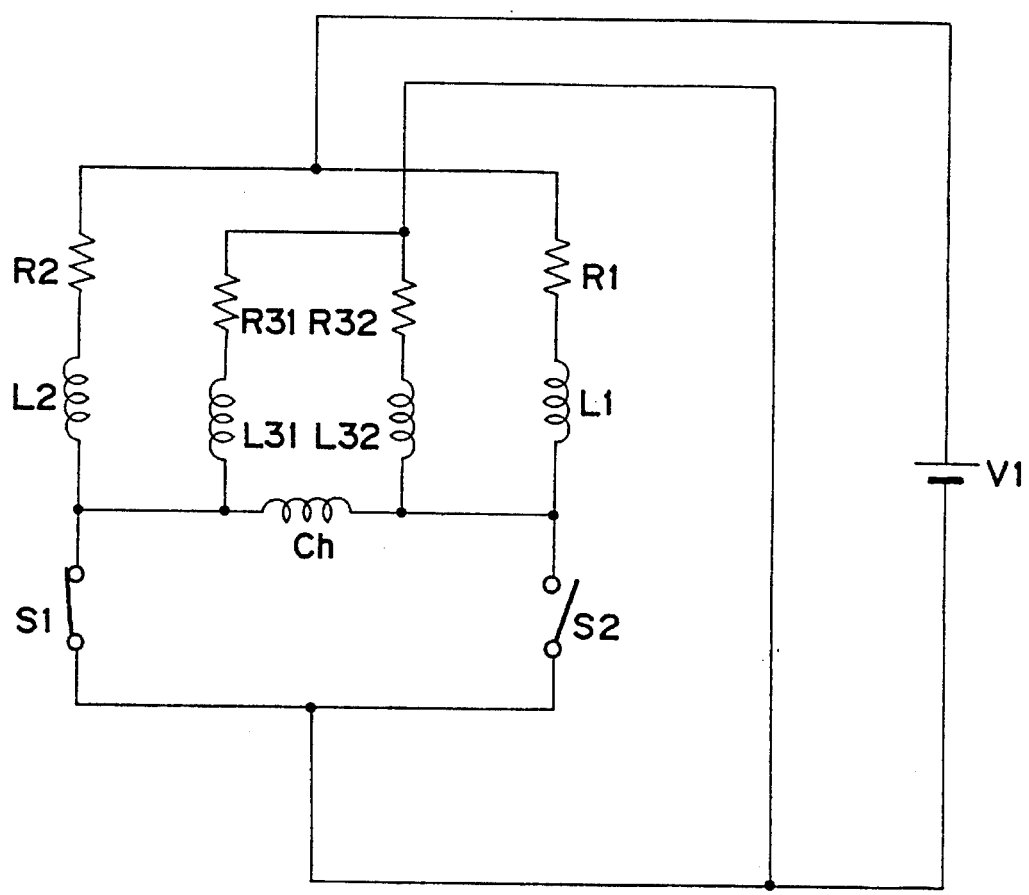

In the embodiments described above, the acceleration coils L31 and L32 are connected between the two terminals of the excitation coil $C_h$ and the DC voltage source V2. Alternatively, a common voltage source may be used for the voltage source V2 connected to the acceleration coils and a voltage source for supplying a current to the auxiliary coils L1 and L2. Also, as shown in FIG. 40, the acceleration coils L31 and L32 may be connected between the two terminals of the excitation coil $C_h$ and ground, and the same effect as described above can be expected in this case.

The above-mentioned embodiments of the present invention have an effect of shortening the current inversion time of the excitation coil, and attaining high-speed inversion of a magnetic field generated by the magnetic head since the acceleration coils are connected between the two terminals of the excitation coil and the DC voltage source or ground. Therefore, the above embodiments can be suitably used as a magnetic head driving device for the pit edge recording method, which requires high-speed inversion of a bias magnetic field. When such a device is used in the magnetooptical recording apparatus of the magnetic field modulation type, it can remarkably contribute to an increase in information recording density.

What is claimed is:

1. A magnetic head driving device comprising:
   a power source;
   a magnetic field generation core;
   a magnetic field generation coil wound around said magnetic field generation core, wherein the inductance of said magnetic field generation coil is Lh;
   a switch element for switching a path of current to be supplied to said magnetic field generation coil from said power source;
   an acceleration coil, connected in parallel with said magnetic field generation coil and branched off the current path, for accelerating shortening of an inversion time of current supplied to said magnetic field generation coil, wherein the inductance of said acceleration coil is Lk and a synthesized inductance L of said magnetic field generation coil and said acceleration coil is less than the inductance Lh of said magnetic field generation coil; and
   means for blocking a current flowing into said acceleration coil.

2. A magnetic head driving device according to claim 1, wherein said current blocking means comprises a current limiting resistor connected in series with said acceleration coil.

3. A magnetic head driving device according to claim 1, wherein said current blocking means comprises at least one element having high-frequency band pass characteristics connected in series with said acceleration coil.

4. A magnetooptical recording apparatus comprising:
   an optical head for irradiating a light beam onto a magnetooptical recording medium; and
   a magnetic field generation device for applying a magnetic field to the magnetooptical recording medium, said magnetic field generation device comprising (i) a power source, (ii) a magnetic field generation core, (iii) a magnetic field generation coil wound around said magnetic field generation core, wherein the inductance of said magnetic field generation coil is Lh, (iv) a switch element for switching a path of current to be supplied to said magnetic field generation coil from said power source, (v) an acceleration coil, connected in parallel with said magnetic field generation coil and branched off the current path, for accelerating shortening of an inversion time of current supplied to said magnetic field generation coil, wherein the inductance of said acceleration coil is Lk and a synthesized inductance L of said magnetic field generation coil and said acceleration coil is less than the inductance Lh of said magnetic field generation coil, and (vi) means for blocking a current flowing into said acceleration coil.

5. A magnetooptical recording apparatus according to claim 4, wherein said current blocking means comprises a current limiting resistor connected in series with said acceleration coil.

6. A magnetooptical recording apparatus according to claim 4, wherein said current blocking means comprises at least one element having high-frequency band pass characteristics connected in series with said acceleration coil.

7. A magnetic head driving device comprising:
   a power source;
   a magnetic field generation core;
   a magnetic field generation coil wound around said magnetic field generation core;
   a switch element for switching a path of current to be supplied to said magnetic field generation core from said power source;
   a secondary coil wound around said magnetic field generation core;
   an acceleration circuit, connected to said secondary coil, for accelerating shortening of an inversion time of current supplied to said magnetic field generation coil, wherein a synthesized inductance of said magnetic field generation coil and said acceleration circuit is less than the inductance of said magnetic field generation coil; and
   means for blocking a current flowing into said acceleration coil.

8. A magnetic head driving device according to claim 7, wherein said acceleration circuit comprises a current limiting resistor.

9. A magnetic head driving device according to claim 7, wherein said acceleration circuit comprises at least one element having high-frequency band pass characteristics.

10. A magnetooptical recording apparatus comprising:
    an optical head for irradiating a light beam onto a magnetooptical recording medium; and
    a magnetic field generation device for applying a magnetic field to the magnetooptical recording medium, said magnetic field generation device comprising (i) a power source, (ii) a magnetic field generation core, (iii) a magnetic field generation coil wound around said magnetic field generation core, (iv) a switch element for switching a path of current to be supplied to said magnetic field generation coil from said power source, (v) a secondary coil wound around said magnetic field generation core, (vi) an acceleration circuit, connected to said secondary coil, for accelerating shortening of an inversion time of current supplied to said magnetic field generation coil, wherein a synthesized inductance of said magnetic field generation coil and said acceleration circuit is less than the inductance of said magnetic field generation coil, and (vii) means for blocking a current flowing into said acceleration circuit.

11. A magnetooptical recording apparatus according to claim 10, wherein said acceleration circuit comprises a current limiting resistor.

12. A magnetooptical recording apparatus according to claim 10, wherein said acceleration circuit comprises at least one element having high-frequency band pass characteristics.

13. A magnetic head driving device according to claim 1, further comprising an auxiliary coil provided in the current path and having an inductance sufficiently greater than that of said magnetic field generation coil.

14. A magnetic head driving device according to claim 1, wherein said acceleration coil is provided between both ends of said magnetic field generation coil.

15. A magnetic head driving device according to claim 1, wherein said acceleration coil is provided between both ends of said magnetic field generation coil and said power source.

16. A magnetic head driving device according to claim 1, wherein said acceleration coil is provided between both ends of said magnetic field generation coil and ground.

17. A magnetooptical recording apparatus according to claim 4, further comprising an auxiliary coil provided in the current path and having an inductance sufficiently greater than that of said magnetic field generation coil.

18. A magnetooptical recording apparatus according to claim 4, wherein said acceleration coil is provided between both ends of said magnetic field generation coil.

19. A magnetooptical recording apparatus according to claim 4, wherein said acceleration coil is provided between both ends of said magnetic field generation coil and said power source.

20. A magnetooptical recording apparatus according to claim 4, wherein said acceleration coil is provided between both ends of said magnetic field generation coil and ground.

21. A magnetic head driving device according to claim 7, further comprising an auxiliary coil provided in the current path and having an inductance sufficiently greater than that of said magnetic field generation coil.

22. A magnetooptical recording apparatus according to claim 10, further comprising an auxiliary coil provided in the current path and having an inductance sufficiently greater than that of said magnetic field generation coil.

23. A magnetic head driving device comprising:

a power source;

a magnetic field generation core;

a first magnetic field generation coil wound around said magnetic field generation core;

a second magnetic field generation coil wound around said magnetic field generation core;

a switch element for switching between a first path of current supplied to said first magnetic field generation coil from said power source and a second path of current supplied to said second magnetic field generation coil from said power source;

an acceleration coil, arranged in parallel to said first and second magnetic field generation coils and branched off from the first and second current paths, for accelerating shortening of an inversion time of current supplied to said first and second magnetic field generation coils, wherein a synthesized inductance of said first and second magnetic field generation coils and said acceleration coil is less than that of said first and second magnetic field generation coils; and means for blocking a current flowing into said acceleration coil.

24. A magnetic head driving device according to claim 23, wherein said acceleration coil is provided between an end of said first and second magnetic field generation coils and said power source.

25. A magnetic head driving device according to claim 23, wherein said acceleration coil is provided between an end of said first and second magnetic field generation coils and ground.

26. A magnetic head driving device according to claim 23, further comprising a current limiting resistor connected in series with said acceleration coil.

27. A magnetic head driving device according to claim 23, further comprising at least one element having high-frequency band pass characteristics connected in series with said acceleration coil.

28. A magnetooptical recording apparatus comprising:

an optical head for irradiating a light beam onto a magnetooptical recording medium; and a magnetic field generation device for applying a magnetic field to the magnetooptical recording medium, said magnetic field generation device comprising (i) a power source, (ii) a magnetic field generation core, (iii) a first magnetic field generation coil wound around said magnetic field generation core, (iv) a second magnetic field generation coil wound around said magnetic field generation core, (v) a switch element for switching between a first path of current supplied to said first magnetic field generation coil from said power source and a second path of current supplied to said first magnetic field generation coil from said power source, (vi) an acceleration coil, arranged in parallel to said first and second magnetic field generation coils and branched off from the first and second current paths, for accelerating shortening of an inversion time of current supplied to said first and second magnetic field generation coils, wherein a synthesized inductance of said first and second magnetic field generation coils and said acceleration coil is less than that of said first and second magnetic field generation coils, and (vii) means for blocking a current flowing into said acceleration coil.

29. A magnetooptical recording apparatus according to claim 28, wherein said acceleration coil is provided between an end of said first and second magnetic field generation coils and said power source.

30. A magnetooptical recording apparatus according to claim 28, wherein said acceleration coil is provided between an end of said first and second magnetic field generation coils and ground.

31. A magnetooptical recording apparatus according to claim 28, further comprising a current limiting resistor connected in series with said acceleration coil.

32. A magnetooptical recording apparatus according to claim 28, further comprising at least one element having high-frequency band pass characteristics connected in series with said acceleration coil.

33. A device according to claim 7, wherein said acceleration circuit comprises an acceleration coil.

34. An apparatus according to claim 10, wherein said acceleration circuit comprises an acceleration coil.

* * * * *

UNITED STATES PATENT AND TRADEMARK OFFICE
CERTIFICATE OF CORRECTION

PATENT NO. : 5,559,763
DATED : September 24, 1996
INVENTOR(S) : KAZUYOSHI ISHII

It is certified that error appears in the above-indentified patent and that said Letters Patent is hereby corrected as shown below:

ON THE COVER PAGE:

Under "U.S. PATENT DOCUMENTS," item [56]

"Shibuga" should read --Shibuya--.

Under "OTHER PUBLICATIONS," item [56]

"vol. 16, No. 543," should read --vol. 13, No. 543,--;
"01-272038," should read --03-272038,--.

UNITED STATES PATENT AND TRADEMARK OFFICE
CERTIFICATE OF CORRECTION

PATENT NO. : 5,559,763          Page 2 of 2
DATED      : September 24, 1996
INVENTOR(S): KAZUYOSHI ISHII It is certified that error appears in the above-indentified patent and that said Letters Patent is hereby corrected as shown below:

COLUMN 11:

Line 27, "filter" should read --filter,--.

Signed and Sealed this

Twenty-fifth Day of February, 1997

Attest:

BRUCE LEHMAN

Attesting Officer    Commissioner of Patents and Trademarks